(12) United States Patent
Li et al.

(10) Patent No.: US 8,260,246 B1
(45) Date of Patent: Sep. 4, 2012

(54) DATA RATE TRACKING FILTER

(75) Inventors: Yingxuan Li, Saratoga, CA (US); Qing Yang, San Jose, CA (US)

(73) Assignee: Marvell International Ltd. (BM)

( * ) Notice: Subject to any disclaimer, the term of this patent is extended or adjusted under 35 U.S.C. 154(b) by 976 days.

(21) Appl. No.: 12/139,979

(22) Filed: Jun. 16, 2008

Related U.S. Application Data

(60) Provisional application No. 60/944,247, filed on Jun. 15, 2007.

(51) Int. Cl.
*H04B 1/16* (2006.01)
(52) U.S. Cl. .................. 455/340; 455/339; 455/226.1; 455/227
(58) Field of Classification Search .................. 455/266, 455/339, 340, 226.1–226.3, 227
See application file for complete search history.

(56) References Cited

U.S. PATENT DOCUMENTS

| | | | | |
|---|---|---|---|---|
| 3,787,774 A | * | 1/1974 | Tietze et al. | 327/556 |
| 4,045,740 A | * | 8/1977 | Baker | 455/266 |
| 4,839,573 A | * | 6/1989 | Wise | 318/615 |

* cited by examiner

*Primary Examiner* — Tuan A Tran
(74) *Attorney, Agent, or Firm* — Brinks Hofer Gilson & Lione

(57) ABSTRACT

The following embodiments relate to an analog filter having an adjustable transfer function for use in a system or circuit that processes a signal having a changing data rate. The transfer function may be adjusted by adjusting the resistance and/or capacitance of components of the analog filter. The analog filter is calibrated based on an optimum operational parameter at a certain data rate, such as a median data rate. The analog filter may be further adjusted as the data rate of the signal changes.

23 Claims, 22 Drawing Sheets

DATA RATE TRACKING FILTER

RELATED APPLICATION

This application claims the benefit of U.S. Provisional Application No. 60/944,247, filed on Jun. 15, 2007, which is incorporated herein by reference.

BACKGROUND

1. Technical Field

The present disclosure relates to signal filtering, and more particularly to calibrating and controlling a data rate tracking analog filter or equalizer.

2. Related Art

An analog filter (also referred to as an "equalizer") may be implemented in a circuit to normalize the frequency response of the circuit through a frequency range of an input (or other) signal. "Normalize" refers to compensating for an unequal frequency response of the circuit. As an example, analog filters may implement low pass and/or high pass filters to vary the zero and pole locations of the circuit. Analog filters are implemented in many types of circuits and systems for normalizing frequency response.

BRIEF SUMMARY

The following embodiments relate to an analog filter having an adjustable transfer function for use in a system or circuit that processes a signal having a changing data rate. The transfer function may be adjusted by adjusting the resistance and/or capacitance of the analog filter's components. The analog filter is calibrated based on an optimum operational parameter at a selected data rate, such as a median data rate. The analog filter may be further adjusted as the data rate of the signal changes.

In a preferred embodiment, a method comprises determining a first control signal to set a parameter of a filter. The first control signal may be based on a frequency range of an input signal to the filter. The method may also include monitoring the frequency of the input signal and responsively adjusting a second control signal based on the frequency. The second control signal is communicated to the filter to adjust the parameter. The parameter preferably determines a transfer characteristic of the filter. The parameter may be a resistance value of the filter, as an example, and may initially be determined based on an approximate median frequency of the input signal within a frequency range of the input signal. The frequency of the input signal may track a data rate of a signal to be filtered. In a version, the parameter is initially set to an approximate median voltage of a linear region of a gate voltage-to-resistance characteristic of a transistor. The transistor determines the resistance of a variable resistor of the filter, the resistance determines the parameter, and the parameter determines the transfer characteristic of the filter.

The method may also include applying the second control signal as a gate voltage to a plurality of gate-controlled resistors that comprise the filter. The first control signal may correspond to a sub-combination of the plurality of gate-controlled resistors. The method may also comprise converting the frequency of the input signal to a first frequency signal, generating a second frequency signal that mirrors the first frequency signal, and adjusting the second control signal based on the second frequency signal. Converting the frequency of the input signal to the first frequency signal may include generating a voltage based on the frequency, and generating the first frequency signal based on a comparison of the generated voltage to a constant voltage. The method may also include comparing a constant voltage to a node voltage to generate the second control signal, wherein the node voltage is based on the first control signal and the second frequency signal. In a version, a third control signal is communicated to the filter to select a combination of programmable controlled resistors among a plurality of programmable controlled resistors. The third control signal may be adjusted based on the frequency of the input signal. In an application, the input signal may be used to determine a radial error signal for an optical disk drive.

An apparatus comprises a signal filter, a first circuit, and a second circuit. The first circuit determines a first control signal to set a parameter of the filter. The first control signal may be based on a frequency range of an input signal to the filter, the input signal having a changing frequency. The second circuit may monitor the frequency of the input signal and responsively adjust a second control signal based on the frequency. The second control signal may be communicated to the filter to adjust the parameter. The parameter may be a resistance value of the filter, and the frequency of the input signal may correspond to a data rate of a signal to be filtered. The parameter may correspond to an approximate median frequency of the input signal within the frequency range. In a version, the filter may comprise a transistor based variable resistor. The parameter may initially be set for an input signal having a frequency approximate equal to a median frequency within a frequency range of the input signal. In a version, the parameter initially is set to an approximate median voltage of a linear region of a gate voltage-to-resistance characteristic of a transistor. The transistor may determine the resistance of a variable resistor of the filter. The filter may comprise a plurality of gate-controlled resistors that receive the second control signal as a gate voltage. The first control signal may correspond to a combination of the plurality of gate-controlled resistors.

The apparatus may also include a third circuit to convert the frequency of the input signal to a first frequency signal, generate a second frequency signal that mirrors the first frequency signal, and communicate the second frequency signal to the second circuit to adjust the second control signal. The third circuit may have a constant voltage source to generate a constant voltage, a switched capacitor to generate a voltage based on the frequency and the first frequency signal, and a voltage amplifier to generate the first frequency signal based on the generated voltage and the constant voltage. The apparatus may include a voltage amplifier and a constant voltage source to generate a constant voltage. The voltage amplifier may have a first input, a second input, and an output. A constant voltage may be received at the first input, and a node voltage, based on the first control signal and the second frequency signal, may be received at the second input. The output is the second control signal. The filter may comprise a plurality of programmable controlled resistors to receive from a circuit a third control signal for selecting a sub-combination of the programmable controlled resistors. The first circuit may include a calibrator having an increment and decrement counter to receive an output from a comparator. The comparator may have a first input for receiving a first voltage from a constant voltage source and a second input for receiving a second voltage. The second voltage may be based on a substantially median frequency within the frequency range of the input signal.

The apparatus may be embodied in a differential phase detection circuit of an optical disk drive or any other circuit.

An apparatus comprises one or more of the following: means for determining a first control signal to adjust a parameter of a filter; means for monitoring the frequency of the input signal and responsively adjusting a second control signal based on the frequency; means for applying the second control signal as a gate voltage to a plurality of gate-controlled resistors that comprise the filter; means for converting the frequency to a first frequency signal; means for generating a second frequency signal that mirrors the first frequency signal; means for adjusting the second control signal based on the second frequency signal; means for generating the first frequency signal based on comparing a generated voltage to a constant voltage; and/or means for comparing a constant voltage to a node voltage to generate the second control signal.

A computer readable storage median has processor executable instructions to determine a first control signal to adjust a parameter of a filter, monitor the frequency of an input signal to the filter, and/or responsively adjust a second control signal based on the frequency. The parameter may be based on a frequency range of an input signal to the filter, as an example. The parameter may be a resistance value of the filter, and the frequency of the input signal may correspond to a data rate of the input signal. The parameter may correspond to an approximate median frequency of the input signal within the frequency range. The processor executable instructions may also be executed to communicate first and second control signals to the filter to adjust the parameter. In this version, the parameter may be an approximate median voltage of a linear region of a gate voltage-to-resistance characteristic of the transistor at an approximate median frequency of the input signal within the frequency range. Additional acts that may be included in the instructions include: converting the frequency to a first frequency signal; generating a second frequency signal that mirrors the first frequency signal; communicating the second frequency signal to the second circuit to adjust the second control signal; generating a voltage based on the frequency and the first frequency signal; generating the first frequency signal based on the generated voltage and the constant voltage; selecting a sub-combination of programmable controlled resistors in a filter; and/or incrementing and/or decrementing a count to determine the second control signal.

Other systems, methods, and features of the invention will be, or will become, apparent to one with skill in the art upon examination of the following figures and detailed description. It is intended that all such additional systems, methods, features and advantages be included within this description, be within the scope of the invention, and be protected by the following claims.

The preferred embodiments will now be described with reference to the attached drawings.

DETAILED DESCRIPTION OF THE PRESENTLY PREFERRED EMBODIMENTS

The disclosure can be better understood with reference to the following drawings and description. The components in the figures are not necessarily to scale, emphasis instead being placed upon illustrating the principles of the invention. Moreover, in the figures, like referenced numerals designate corresponding parts or elements throughout the different views.

The embodiments below relate to a calibration and control technique for a wide range continuous data rate tracking analog filter or equalizer (hereinafter "analog filter"). The analog filter has two modes. During a calibration mode, MOS process variations of the analog filter are calibrated out to optimize the analog filter's transfer function at a median (or other selected) data rate of an input (or other) signal to be filtered (hereinafter referred to as the "input signal"). In a tracking mode, a master circuit adjusts the transfer function as the data rate changes to improve the performance of the analog filter. Thus, as the affect that a circuit has on an input signal changes in response to changes in the data rate (or frequency) of the input signal, the analog filter is adjusted to reverse the channel's effect on the input signal.

Figure 1A:
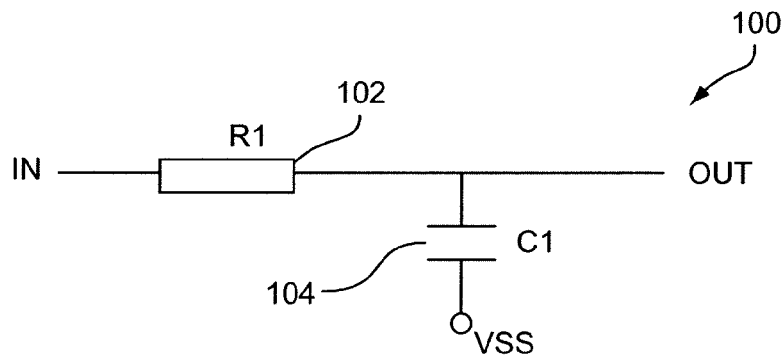
FIG. 1(a) is a circuit diagram of a low pass filter.
Figure 1B:
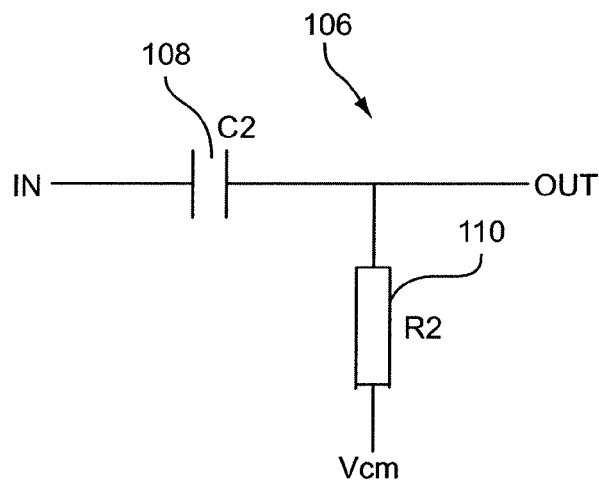
FIG. 1(b) is a circuit diagram of a high pass filter.

FIGS. 1(a) and 1(b) illustrate RC implementations of low pass and high pass filters, respectively. FIG. 1(a) is a circuit diagram of a low pass filter 100 having a resistor 102 and a capacitor 104. FIG. 1(b) is a circuit diagram of a high pass filter 106 having a capacitor 108 and a resistor 110. The transfer function for the low pass filter 100 is $1/(SR_1C_1+1)$. The transfer function for the high pass filter 106 is $SR_2C_2/(SR_2C_2+1)$.

Figure 1C:
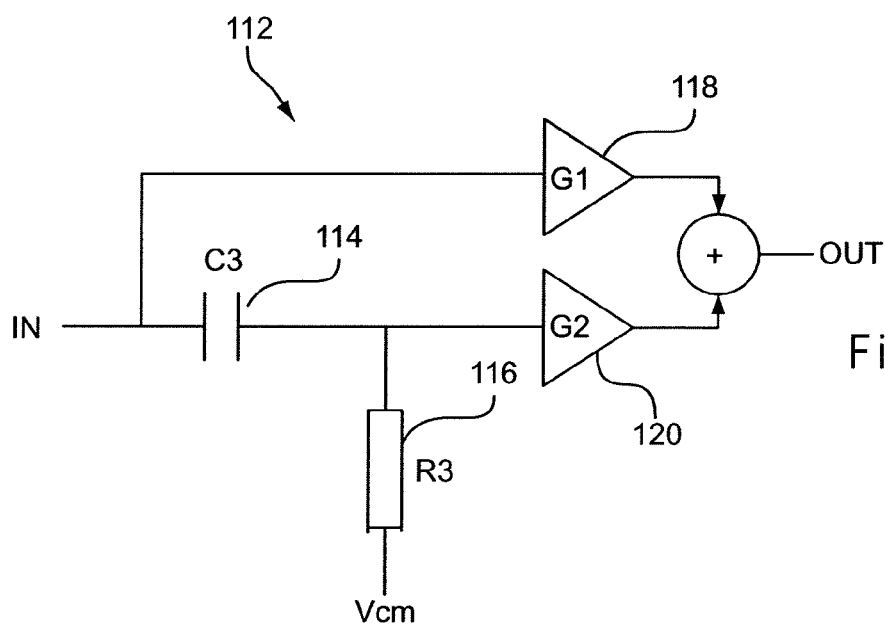
FIG. 1(c) is a circuit diagram of a filter that may be implemented as a low pass filter or a high pass filter.

FIG. 1(c) is a circuit diagram of a filter 112 that may be implemented as a low pass filter or a high pass filter. The filter 112 has a capacitor 114, a resistor 116, and first and second voltage gain buffers G1 118 and G2 120, respectively. If the bandwidths of G1 118 and G2 120 are much higher than the poles and zeros of the RC circuit, the poles and zeros of G1 118 and G2 120 will not affect the filter 112. The transfer function for the filter 112 is given by Equation 1.

$$((G2+G1) \cdot SR_3C_3+G1)/(SR_3C_3+1)$$

Equation 1: Transfer Function of FIG. 1(c)

The transfer function of Equation 1 can be a high pass transfer function or a low pass transfer function depending on the signs of G1 and G2. For example, if G1 is zero, FIG. 1(c) is reduced to FIG. 1(b) which is a high pass filter with a zero on the origin. On the other hand, if G1 and G2 are both positive, FIG. 1(c) is a high pass filter having a zero at $-G1/(G1+G2) \cdot R_3C_3$ and pole at $-1/R_3C_3$. If G2 is negative and G1 is positive, and (G1+G2)>0, then FIG. 1(c) is a low pass filter having a pole at a frequency less than zero. Because G1 and G2 can be either positive or negative, the zero can be located on the left side or the right side of the poles/zeros plane. In other words, including G1 and G2 in the filter provides flexibility for placing the zero.

Figure 2A:
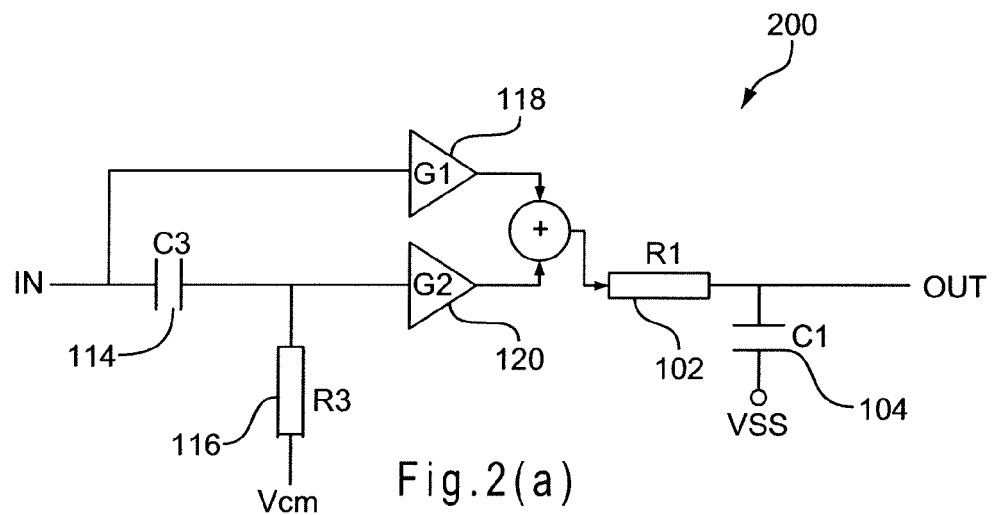
FIG. 2(a) is a circuit diagram of a filter having a low pass filter and a high pass filter.
Figure 2B:
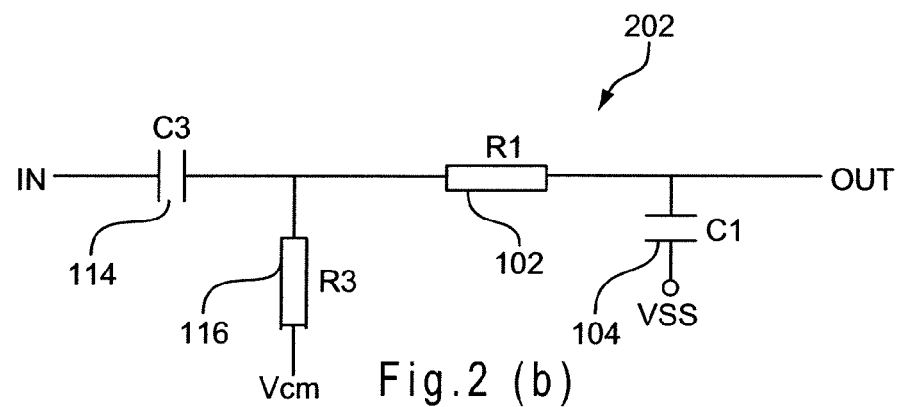
FIG. 2(b) is a circuit diagram of the filter of FIG. 2(a) without gain buffers.

FIG. 2(a) is a circuit diagram of a filter 200 that includes the low pass 100 and high pass 112 filters of FIGS. 1(a) and 1(c). The filter 200 may be implemented without the gain buffers 118 and 120. FIG. 2(b) is a circuit diagram of a filter 202 without the gain buffers 118 and 120. The transfer function of the filter 200 is given by Equation 2. G1 and G2 may be positive or negative real numbers.

$$((G2+G1) \cdot SR_3C_3+G1)/(SR_3C_3+1)(SR_1C_1+1)$$

Equation 2: Transfer Function of FIG. 2(a)

Multiple filters 200 may be cascaded, extending the transfer function to Equation 3.

$$G \cdot (s+z0)(s+z1) \ldots (s+zn)/(s+p0)(s+p1) \ldots (s+pm)$$

Equation 3: Transfer Function of FIG. 2(a) having Cascaded Stages

Figure 3A:
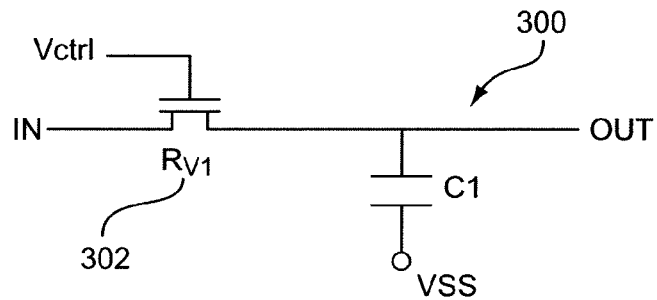
FIG. 3(a) is a circuit diagram of the low pass filter of FIG. 1(a) having a variable resistor.
Figure 3B:
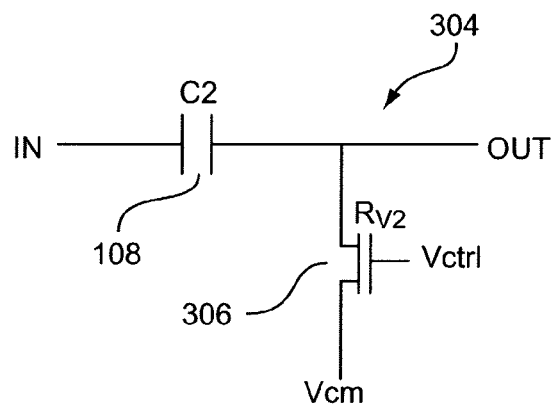
FIG. 3(b) is a circuit diagram of the high pass filter of FIG. 1(b) having a variable resistor.
Figure 3C:
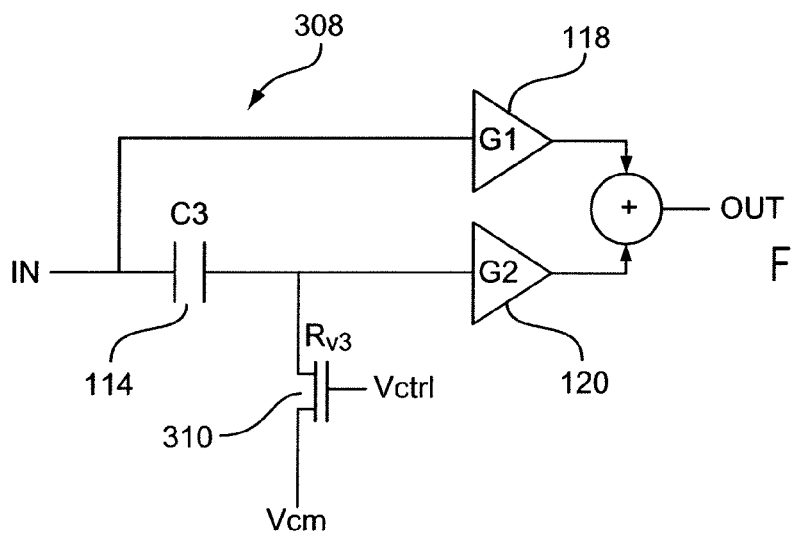
FIG. 3(c) is a circuit diagram of the filter of FIG. 1(c) having a variable resistor.

The filter structure shown in any of FIGS. 1(a)-1(c), 2(a) and 2(b) may be used to implement an adjustable filter having a flexible transfer function. FIGS. 3(a), 3(b), and 3(c) are circuit diagrams of the filters of FIGS. 1(a), 1(b), and 1(c), respectively, having resistors $R_1$ 102, $R_2$ 110, and $R_3$ 116 replaced with variable resistors $R_{V1}$ 302, $R_{V2}$ 306, and $R_{V3}$ 310, respectively. In FIGS. 3(a), 3(b), and 3(c), the resistance of the variable resistors are controlled by a gate voltage, Vctrl. In this version, the zero and pole locations for the filters 300, 304, and 308 can be varied by adjusting the gate voltage Vctrl to change the resistance ($R_{V1}$ 302, $R_{V2}$ 306, and $R_{V3}$ 310).

Figure 4A:
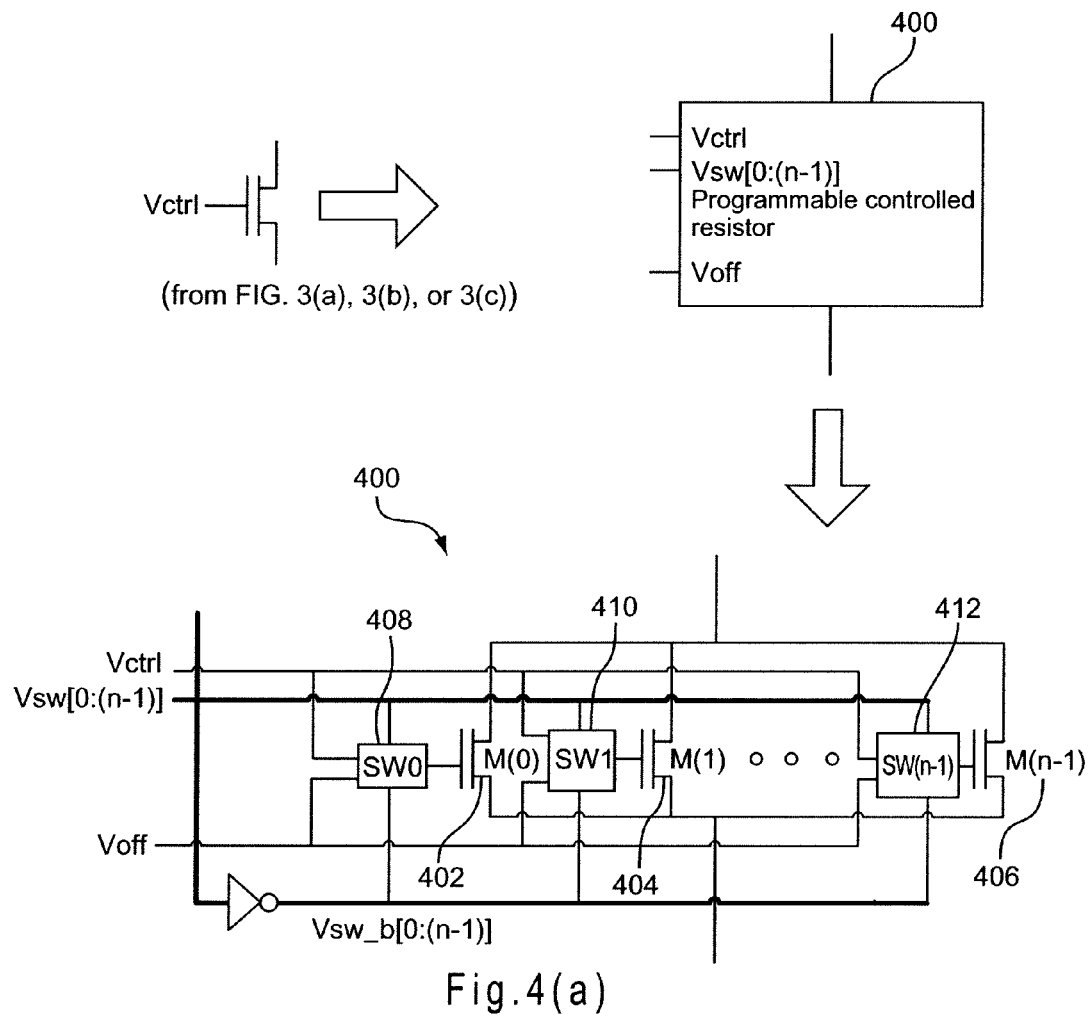
FIG. 4(a) is a circuit diagram of programmable controlled resistor that may be implemented as the variable resistor shown in FIGS. 3(a), 3(b), and 3(c)
Figure 4B:
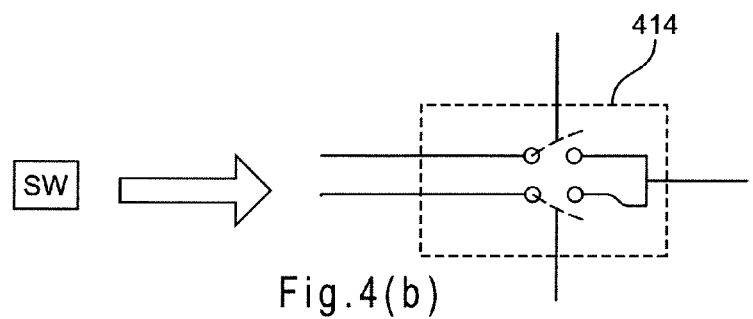
FIG. 4(b) is a diagram of an embodiment of the switch shown in FIG. 4(a)

FIG. 4(a) is a circuit diagram of a programmable controlled resistor 400 that may be implemented as any one of the variable resistors shown in FIGS. 3(a), 3(b), and 3(c), or in any other type of filter. The programmable controlled resistor 400 has n parallel variable resistors. Each variable resistor is implemented by a transistor M(0) 402, M(1) 404, . . . and M(n−1) 406 having its gate voltage controlled by a switch SW0 408, SW1 410, . . . and SW(n−1) 412, respectively. The transistors may have different sizes. Applying the same gate voltage to transistors 402, 404, and 406 will result in different resistance values for each selected resistor. The resistance of the programmable controlled resistor 400 can be varied by selecting different combinations of transistors 402, 404, and 406. The resistance of the programmable controlled resistor 400 is determined by (a) selecting one or a combination of selected variable resistors through a plurality of select control signals $V_{SW}[0:(n-1)]$ (referred to collectively as an "n-bit control signal") and (b) an applied and adjustable gate voltage Vctrl. The gates of the selected transistors are connected to Vctrl. The gates of the transistors that are not selected are connected to Voff. Vctrl may be adjusted to change the resistance of the selected variable resistors, and hence the resistance of the programmable controlled resistor 400. By appropriately designing the size of each transistor 402, 404, . . . 406, a programmable controlled resistor 400 is formed. The resistance is a function of Vsw[0: (n−1)] and Vctrl. FIG. 4(b) is a diagram of an embodiment of a switch 414 that may be implemented as each switch (SW) of FIG. 4(a).

Figure 5:
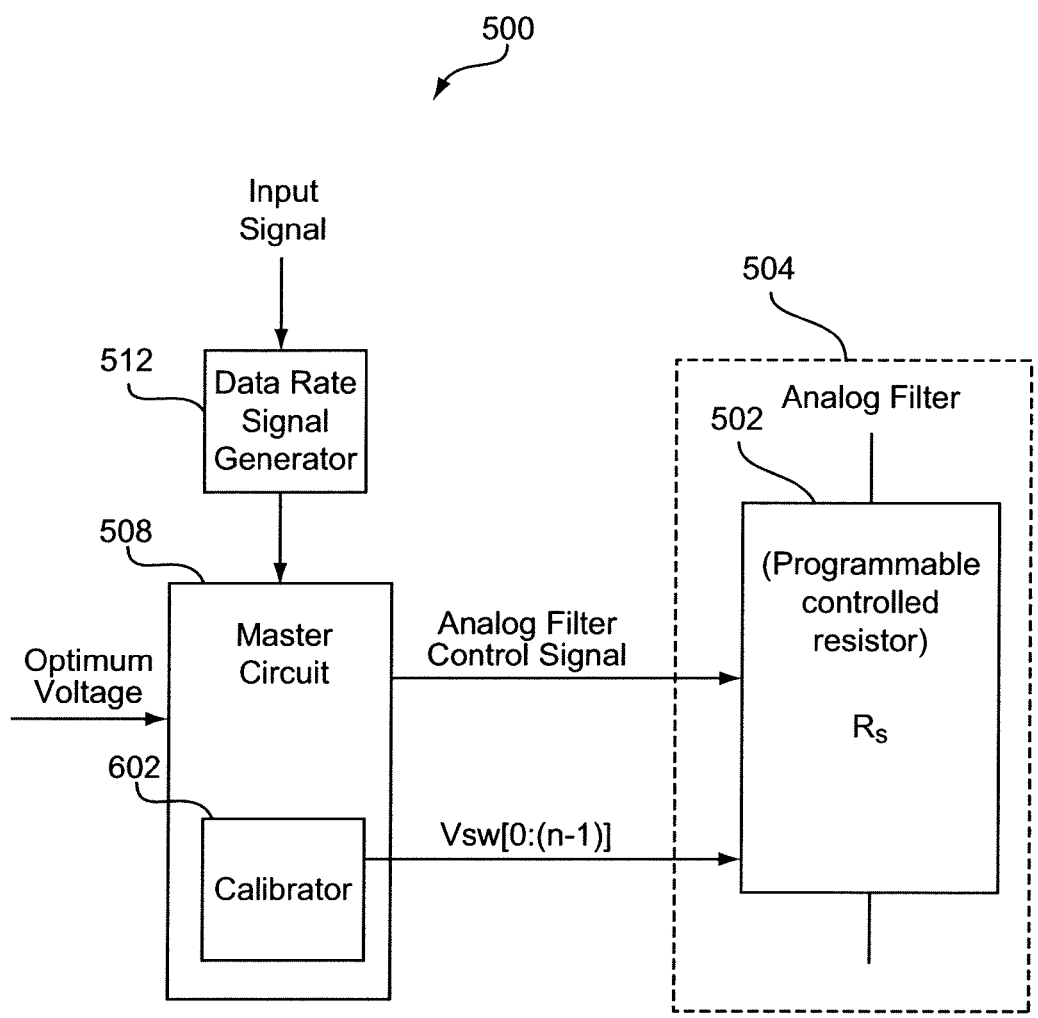
FIG. 5 is a functional diagram of an embodiment of a data rate tracking analog filter.

FIG. 5 is a functional block diagram of an embodiment of a data rate tracking analog filter 500. For clarity of explanation, only a programmable controlled resistor 502 of the analog filter 504 portion of the data rate tracking analog filter 500 is shown. However, it is understood that the analog filter 504 may be implemented by any of the filters shown in FIGS. 3(a)-3(c) and 4(a), or any other analog filter or equalizer that may implement a variable resistor, either now known or later developed.

Figure 11A:
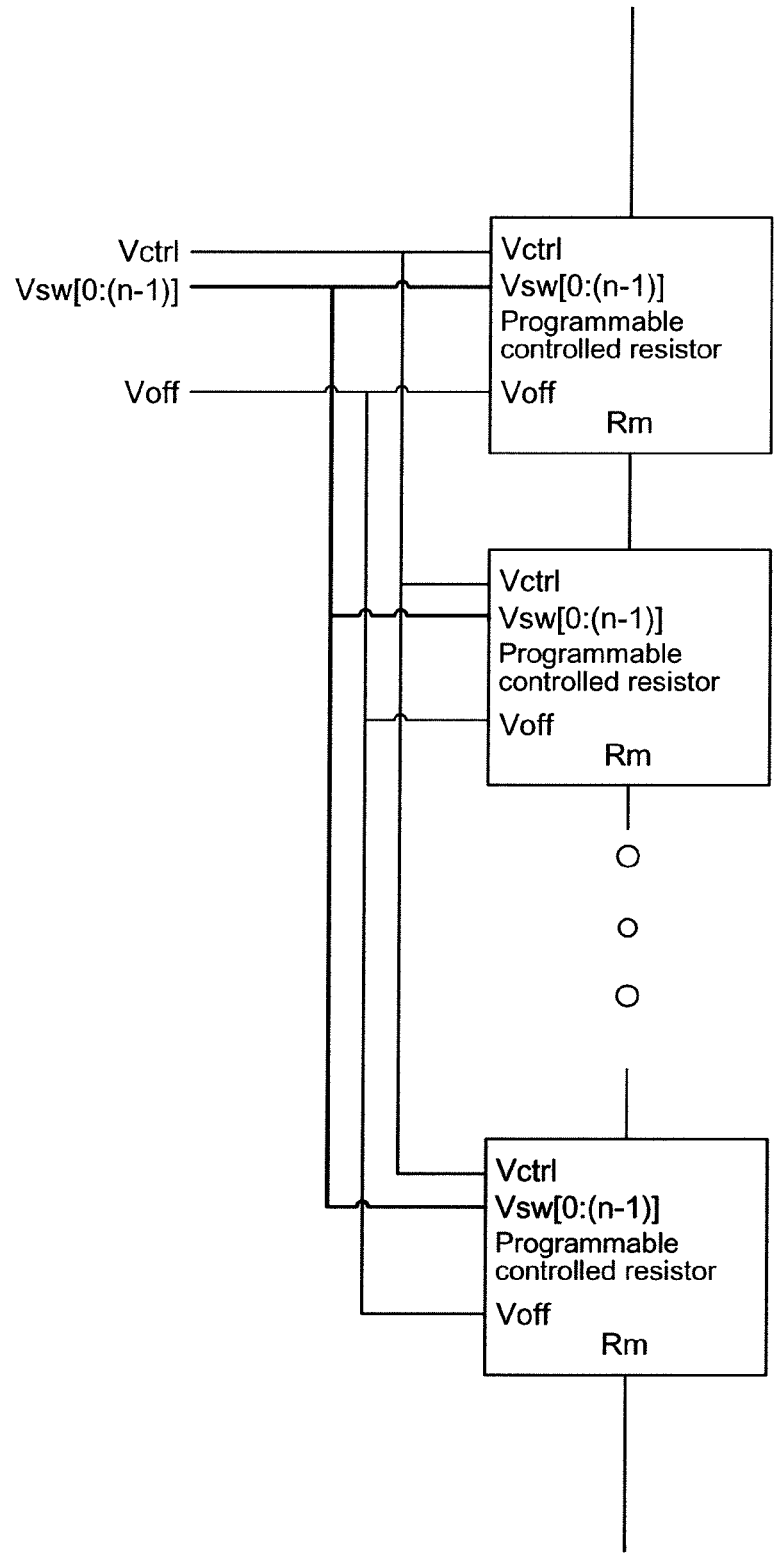
FIG. 11(a) is a block diagram showing programmable controlled resistors connected in series.
Figure 11B:
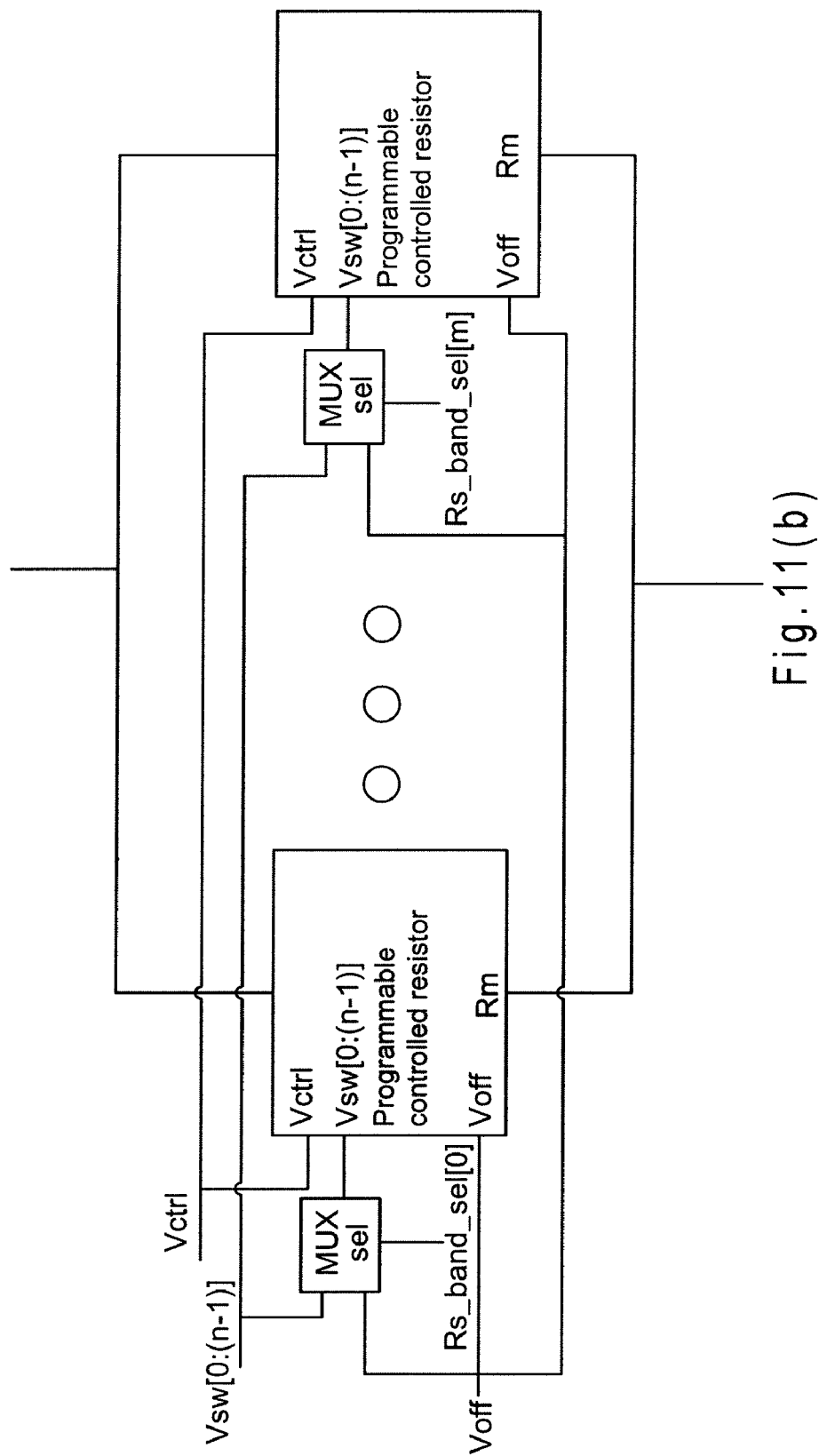
FIG. 11(b) is a block diagram showing programmable controlled resistors connected in parallel.

The transfer function of the analog filter 504 is dependent upon the resistance of the programmable controlled resistor 502. In the embodiment of FIG. 5, the resistance is controlled by (a) an n-bit control signal (indicated in the FIGS. 5 and 6 as $V_{SW}[0: (n-1)]$) and (b) an analog filter control signal (sometimes referred to as Vctrl). The n-bit control signal is generated by a calibrator 602 and communicated to a programmable controlled resistor Rm (600 in FIG. 6) within the master circuit 508 and to one or more similar programmable controlled resistors that comprise the programmable controlled resistor Rs 502. An example of programmable controlled resistors that may comprise programmable controlled resistor Rs 502 are shown in FIGS. 11(a) and 11(b), discussed below.

The programmable controlled resistor Rm 600 functions as the "master" in a master-slave configuration with the programmable controlled resistors that comprise programmable controlled resistor Rs 502. The calibrator 602 sets the n-bit control signal based on an optimum operational voltage determined for the MOS devices (transistors) of the programmable controlled resistor Rm 600 and the programmable controlled resistors that comprise the programmable controlled resistor Rs 502. The optimum operational voltage may be based on an anticipated median data rate of the input signal, as explained below. A data rate signal generator 512 generates a data rate signal that corresponds to the data rate of the input signal. The data rate signal is communicated to the master circuit 508.

As the data rate of the input signal changes, the analog filter control signal is adjusted, as explained below, to improve the performance of the analog filter 504. Thus, the n-bit control signal ($V_{SW}[0: (n-1)]$) is based on the optimum operational voltage of the MOS devices, and the analog filter control signal is based on the data rate of the input signal. Preferably, as the data rate increases to its maximum or decreases to its minimum, the MOS devices remain in their linear range of operation.

Figure 6:
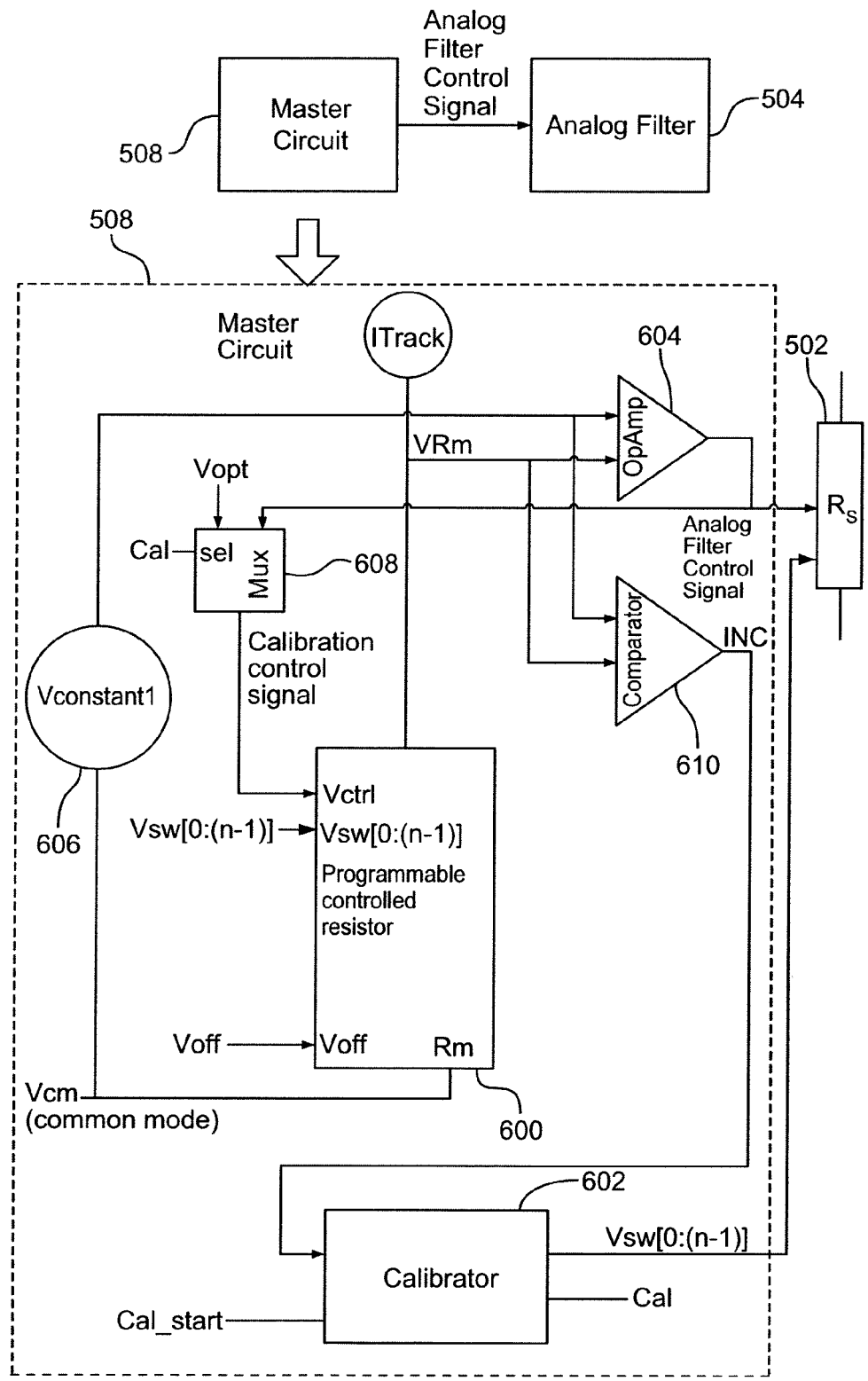
FIG. 6 is a block diagram of an embodiment of the master circuit of FIG. 5.

FIG. 6 is a block diagram of an embodiment of the master circuit 508 of FIG. 5. The master circuit 508 includes the programmable controlled resistor Rm 600 that receives a calibration control signal at a Vctrl input, an n-bit control signal (Vsw[0: (n-1)]) generated by the calibrator 602, and a voltage signal ($V_{off}$) to apply to the variable resistors that are not selected by the n-bit control signal. The calibration control signal, the n-bit control signal, and the $V_{off}$ signal are also communicated to the programmable controlled resistor Rs 502 (consistent with the master-slave configuration).

In the illustrated embodiment, the master circuit 508 includes an operational amplifier (OpAmp) 604 that receives at a first input a predetermined constant voltage (Vconstant1) generated by a constant voltage source 606. A second input of the OpAmp 604 receives a voltage (VRm) that is based on a data rate signal (referred to in FIG. 6 as Itrack) that corresponds to and "tracks" the data rate of the input signal. VRm is also based on the resistance Rm of the programmable controlled resistor 600. Rm is determined using a calibration technique, as explained below. The OpAmp 604 outputs an analog filter control signal for receipt by the programmable controlled resistor 502. As explained above with reference to FIG. 4(*a*), the analog filter control signal may be an adjustable gate voltage (Vctrl in FIG. 4(*a*)). Generation of the data rate signal Itrack is explained below with reference to FIG. 9.

The master circuit 508 has two modes of operation: a calibration mode and a tracking mode. The calibration mode is to calibrate out of the transistors MOS process dependencies or any other type of dependencies. In the tracking mode, the master circuit 508 is in a continuous closed-loop feedback configuration and tracks the data rate of the input signal to generate the analog filter control signal. Because the analog filter control signal controls the resistance of the programmable controlled resistor 502 of the analog filter 504, the poles and zeros may be adjusted as the data rate of the input signal changes. The frequency characteristic of the programmable controlled resistor 502 in this way tracks the data rate of the input signal.

In calibration mode, a "cal" signal is generated by the calibrator 602 and communicated to a multiplexor 608 to select Vopt as the calibration control signal (input to Vctrl of the programmable controlled resistor 600). Vopt is a predetermined voltage that corresponds to a calibration frequency. In tracking mode, the analog filter control signal will settle at (at least approximately) Vopt when the data rate corresponds to the calibration frequency. For calibration, Vopt is preferably the voltage that corresponds to an optimized location (e.g., median) of the linear operating range of the transistors (e.g., MOS transistors) of the variable resistors within both of the programmable controlled resistors 502 and 600. For example, if the Vctrl-verses-resistance curve is linear for the transistors, Vopt is the middle point between the rail voltage (which may be the ground voltage or the supply voltage depending upon whether the transistors are PMOS or NMOS) and the pre-saturation voltage. The pre-saturation voltage is the voltage that is substantially near but not within the saturation region of the transistors. It is noted that normally the Vctrl-verses-resistance curve is not truly linear. Therefore, Vopt may be determined to be close to but not exactly at the middle point of the curve. In a preferred version, Vopt is determined as the voltage that provides substantially equal margins between Vopt and the rail voltage, and Vopt and the pre-saturation voltage point.

By way of example, for a given application it may be assumed that the data rate may vary within a range of 1X to 2X. X may be 24 Mhz, 66 Mhz, or any other frequency that corresponds to a data rate range. During calibration, the frequency of the calibration clock (i.e., the calibration frequency or data rate) is preferably set to a proportion of the square root 1X·2X, in other words 1.4X/k, where k is a scale factor (e.g., 1, 2, 3, or any positive integer) that is determined based on the data rate range of the input signal. Vopt is determined based on the calibration frequency so that substantially equal margins are provided to both end voltages (the rail voltage and the pre-saturation voltage), which correspond to the ends (minimum and maximum) of the data rate range. Vopt provides a transfer function for normalizing the circuit or system that is processing the signal when the data rate of the signal is equal to (or substantially equal to) the calibration data rate.

During tracking mode, the analog filter control signal changes as the data rate changes so that the resistance of the programmable controlled resistor 502 (and hence the transfer function of the analog filter 504) tracks the data rate. As the data rate increases or decreases, Vctrl may eventually approach the rail voltage or the saturation voltage. If Vctrl is allowed to enter the saturation region, the circuit may be increasingly sensitive to noise. Therefore, it is preferred that the programmable controlled resistor 502 be configured so that the transistors will not enter the saturation region to increase resistance. Instead, in a version the resistance of the programmable controlled resistor 502 may be increased by implementing two or more programmable controlled resistors in series.

Figure 7:
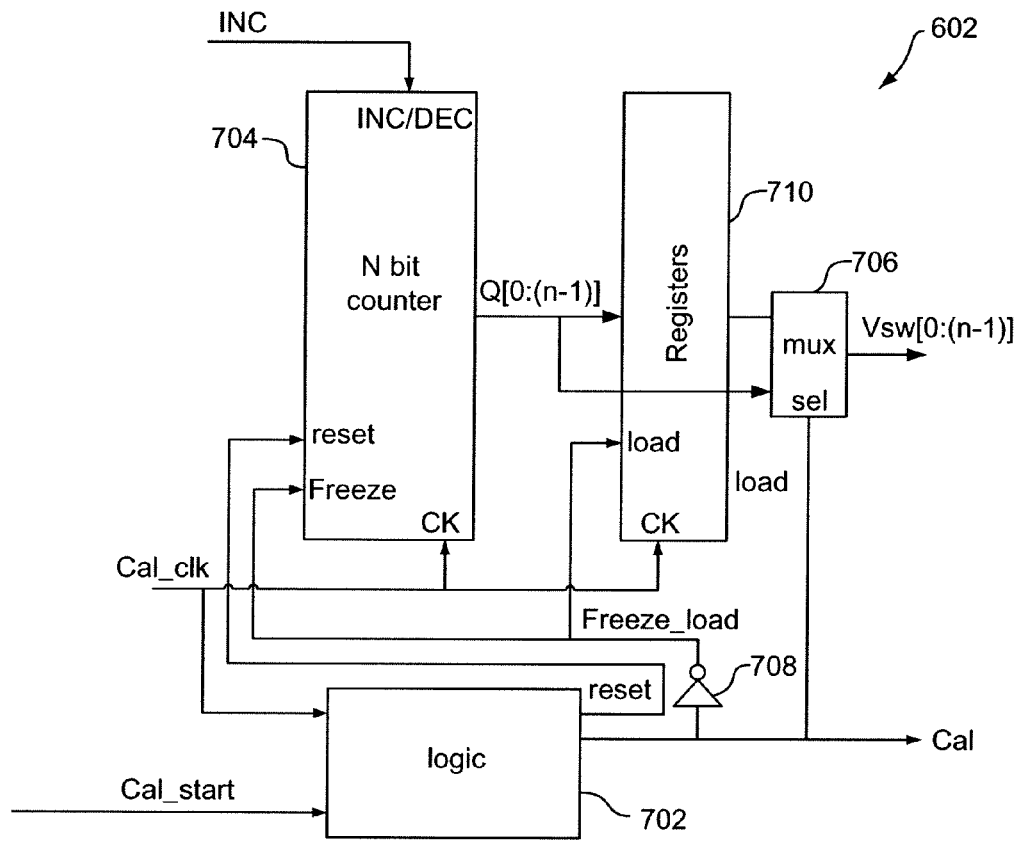
FIG. 7 is a block diagram of an embodiment of the calibrator of FIG. 6.
Figure 7:
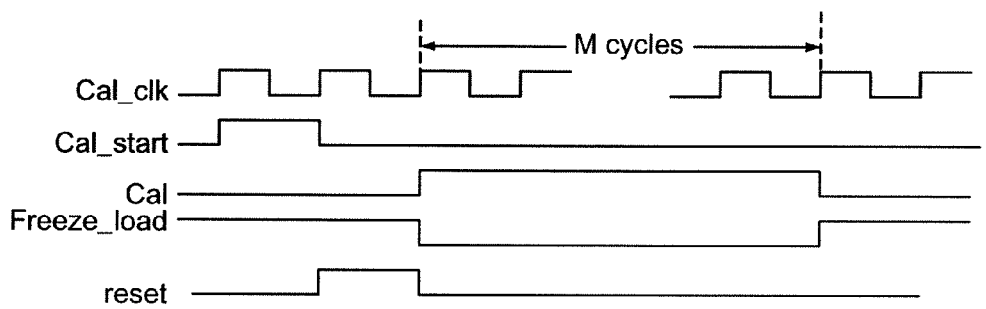
Figure 8:
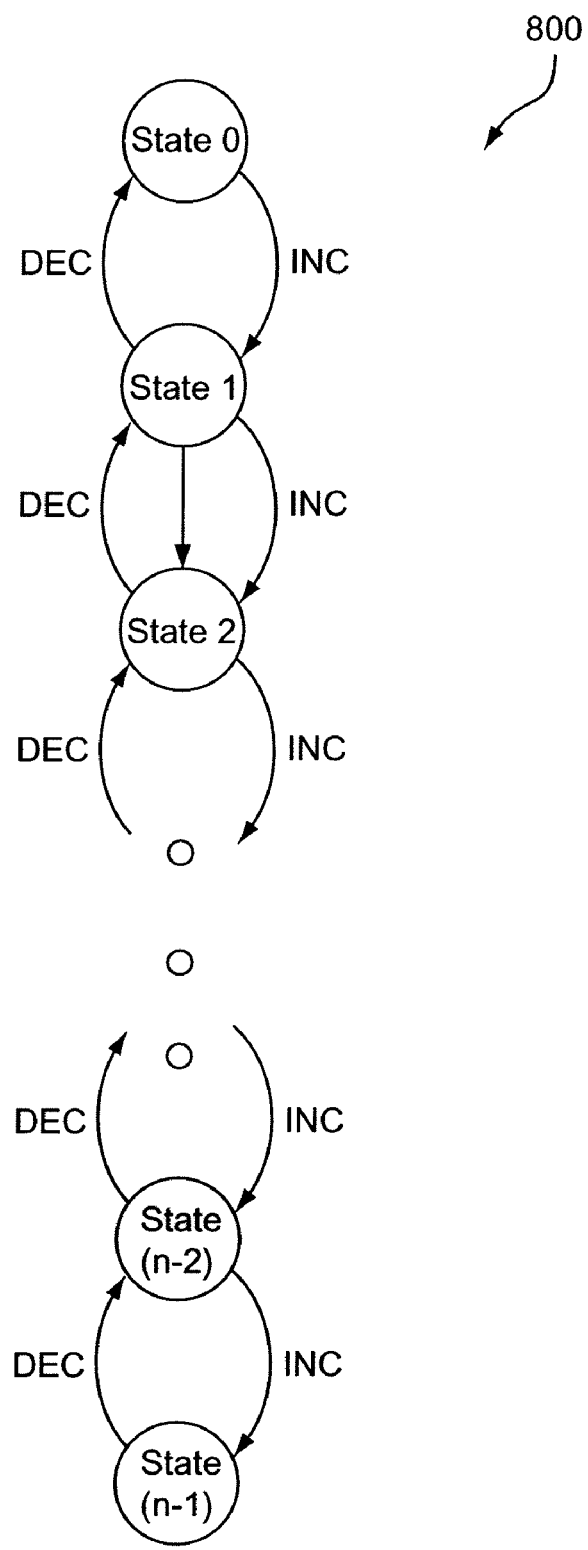
FIG. 8 shows an N-bit increment/decrement counter state machine.

FIG. 7 is a block diagram of an embodiment of the calibrator 602 shown in FIG. 6. Calibration is initiated when a calibration control circuit (referred to as "logic" in FIG. 7) 702 receives a cal_start signal. The cal_start signal may be generated by firmware, as an example. In response to receiving the cal_start signal, the calibration control circuit 702 provides a synchronized "reset" signal to reset an N-bit increment and decrement counter 704 to a pre-determined value. As an example, the predetermined value may be N/2. A state machine representation of the N-bit counter is shown in FIG. 8.

After providing the reset signal, the calibration control circuit 702 communicates a "cal" signal to the select input of a multiplexer 706 and to an inverter 708 and starts an M-bit counter (not shown). The M-bit counter stops counting at the last counting cycle (the $M^{th}$ counting cycle), at which time the calibration control circuit 702 de-asserts the "cal" signal.

During the period "cal" is asserted, the output of the N-bit increment and decrement counter 704 (Q[0: (n-1)]) is selected as the multiplexer output Vsw[0: (n-1)]. During each counting cycle of the M-bit counter, the comparator 610 (in FIG. 6) compares Vconstant1 to VRm (also referred to as a "node voltage"). If VRm is greater than Vconstant1, the comparator output (INC signal) will be high and the N-bit counter will increase by one during the next cal_clk clock cycle. Increasing the N-bit counter by one increases Vsw[0: (n-1)] by one. When Vsw[0: (n-1)] increases by one, the value of the programmable controlled resistor Rm 600 decreases by one least significant bit (LSB). If VRm is less than Vconstant1, the comparator output (INC signal) will be low and the N-bit counter will decrease by one during the next cal-clk clock cycle. Decreasing the N-bit counter by one decreases Vsw[0: (n−1)] by one. When Vsw[0: (n−1)] decreases by one, the value of the programmable controlled resistor Rm 600 increases by one LSB. As the M-counter continues to count, VRm will approach Vconstant1. When the M-bit counter reaches M, the "cal" signal is de-asserted and VRm will be within +/−1 LSB or other range of Vconstant1. The de-asserted "cal" signal triggers a freeze-load signal so that (a) the N-bit increment and decrement counter 704 freezes the count, and (b) the value of the N-bit increment and decrement counter 704 (Q[0:(n−1)]) is loaded into a register 710. The de-asserted "cal" also triggers the multiplexer 706 to select the output of the register 710 as the calibration result (Vsw[0: (n−1)]).

The cycle time of cal_clk is preferably set so that the voltage change across Rm settles within one clock cycle of Vsw[0: (n−1)] changing. Also, in an embodiment M is larger than N/2. M is preferably larger than N/2 by a factor of at least 2 or 3. It is also noted that if the N-bit counter pre-determined reset value is not N/2, M may be selected accordingly.

Figure 9A:
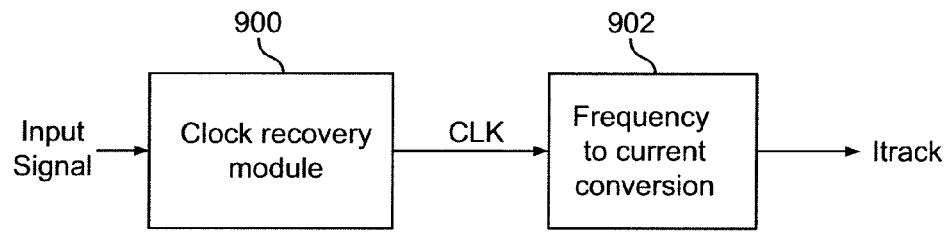
FIG. 9(a) is a functional block diagram for generating a control signal indicative of the data rate of a signal.
Figure 9B:
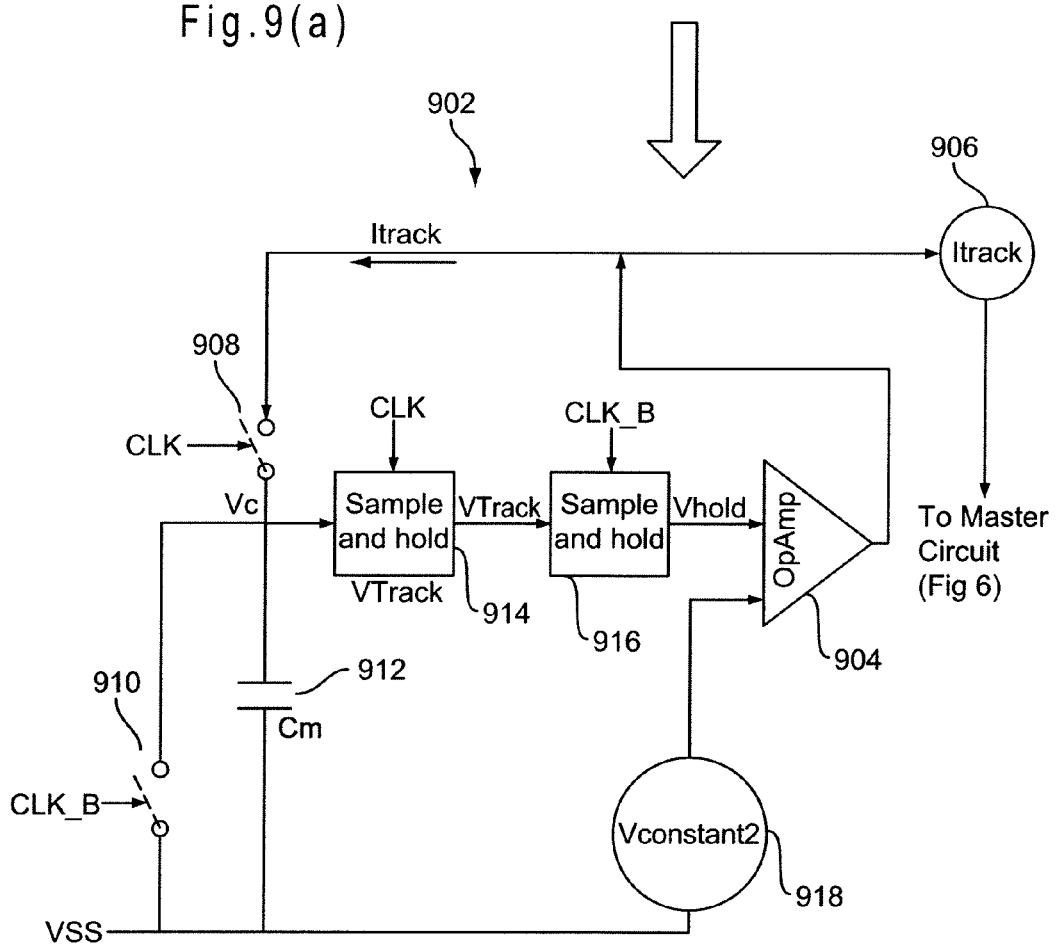
FIG. 9(b) is a circuit diagram of an embodiment of the frequency-to-current conversion circuit of FIG. 9(a)

FIG. 9(*a*) is a functional block diagram for generating a control signal (referred to as "Itrack" above) indicative of the data rate of the input signal. A clock recovery module 900 receives the input signal and generates a clock signal (CLK) that corresponds to the data rate. The CLK signal may be scaled. For example, if the data rate of the input signal is referred to as Fdata, the frequency of the CLK signal (referred to as Fclk) may be expressed as Fclk=Fdata/k; where k is the scale factor. A frequency-to-voltage or frequency-to-current conversion circuit 902 converts the CLK signal to a control signal. The magnitude, frequency, phase, or other characteristic of the control signal may correspond to the data rate. In the illustrated embodiment, the control signal is a current signal, Itrack.

After the calibration mode is complete, the data rate tracking analog filter 500 is prepared for tracking mode. During tracking mode, the analog filter control signal will settle close to or at Vopt while the data rate is 1.4X/k. Referring to FIG. 6, during tracking mode, the multiplexer 608 selects the analog filter control signal as the calibration control signal. Provided the data rate remains within the range of 1X-2X, the frequency of the CLK signal (for generating Itrack) will be proportional to the data rate with a scale factor of k. Because Vopt provides the maximum margin for Vctrl as the data rate changes, Vctrl will remain between the rail voltage and the pre-saturation voltage of the transistors (that comprise the programmable controlled resistors 502 and 600) through the range of 1X-2X. As explained above, the calibration mode calibrates out MOS process dependences so that the analog filter control signal will remain within the linear operating range of the transistors as the data rate changes within this range. During tracking mode, the master circuit 508 automatically adjusts Rm when the data rate changes so that Vconstant1=Itrack·Rm.

FIG. 9(*b*) is a block diagram of an embodiment of the frequency-to-current conversion circuit 902 of FIG. 9(*a*). The frequency-to-current conversion circuit 902 preferably implements a master-slave structure. Within the master, an operational amplifier (OpAmp) 904 communicates a feedback signal to a switched capacitor circuit. The feedback signal is the control signal referred to as Itrack. Itrack is generated by the frequency-to-current conversion circuit 902 and duplicated by a mirroring circuit 906. The mirroring circuit 906 communicates the Itrack current to the master circuit 508.

Figure 10:
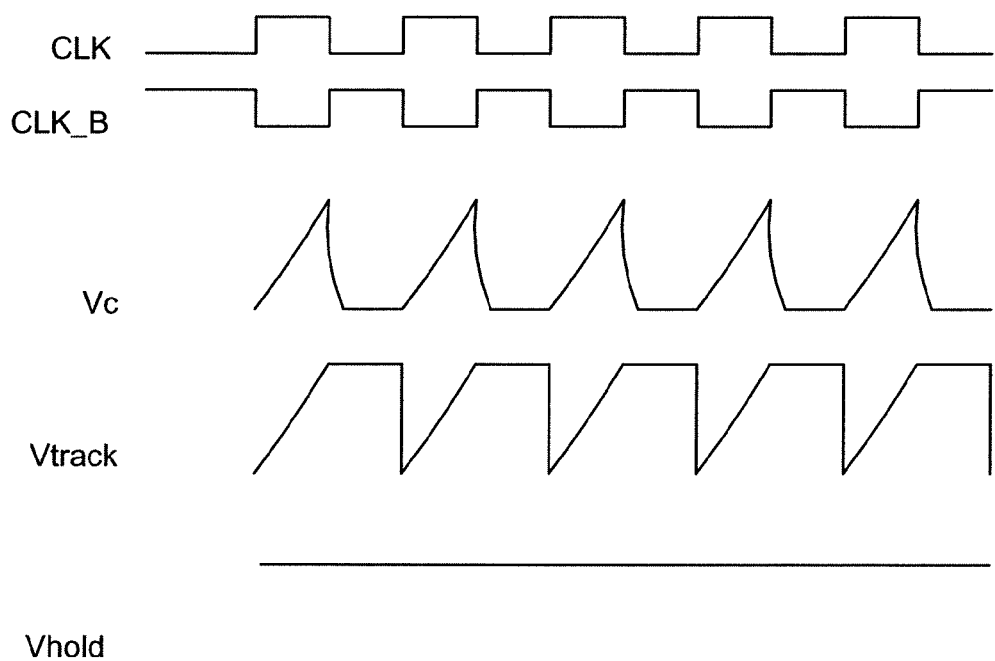
FIG. 10 shows the waveforms of several signals represented in FIG. 9(b)

The Itrack current output from the OpAmp 904 is communicated as a feedback signal to a switch-capacitor circuit that includes a first switch 908 in series with a capacitor Cm 912, and a second switch 910 for discharging Cm 912. CLK and CLK_B are a pair of non-overlapped complementary clock signals. CLK (generated by and received from the clock recovery module 900) controls the first switch 908. CLK_B controls the second switch 910. When the second switch 910 closes and the first switch 908 opens, Vc (the voltage on Cm) resets to VSS (ground). When the second switch 910 opens and the first switch 908 closes, Cm 912 is charged to Vc by the feedback current (Itrack) until the switches reset. A first sample and hold circuit 914 receives the CLK signal, samples-and-holds the voltage Vc, and outputs an intermediate voltage Vtrack. A second sample and hold circuit 916 receives the CLK_B signal, samples-and-holds the Vtrack voltage, and outputs a constant voltage referred to as Vhold. FIG. 10 shows the CLK, CLK_B, Vc, Vtrack, and Vhold signals. As illustrated, Vhold is a constant voltage equal to Vc. The OpAmp 904 receives the Vhold voltage at one input and a constant voltage generated by a constant voltage source (Vconstant2) 918 at the other input, and outputs the control signal (Itrack).

It is noted that Cm 912 represents the total capacitance at Vc, including the dedicated capacitance (the physical capacitor) and the loading capacitance from the sample and hold circuit 914. The feedback circuit may be defined by Equation 4.

$Itrack \cdot Tclk = Cm \cdot Vconstant2$; substituting for $Tclk$ provides $Itrack = Cm \cdot Vconstant2 \cdot Fdata/k$ Equation 4: Frequency-to-Current Conversion Relationship.

The time constants in the analog filter 504 are proportional to the data rate. Fs may represent the analog filter's characteristic (center) frequency. In the embodiment discussed above, Fs is proportional to the data rate. If Rs represents the resistance and Cs represents the capacitance of the analog filter 504, the RsCs time constants that determine the poles and zeros of the analog filter 504 are spaced according to the characteristic frequency. Cs does not change when the data rate changes. Rs, controlled by the analog filter control signal, is inversely proportional to the data rate. In a preferred version, Rs and Cs are scaled from Rm and Cm. For example, Rs and Cs may be scaled by scale factors p and q, such that Rs/Rm=p and Cs/Cm=q. Equation 5 represents the proportional relationship between the analog filter time constant (RsCs) and the data rate.

Figure 11C:
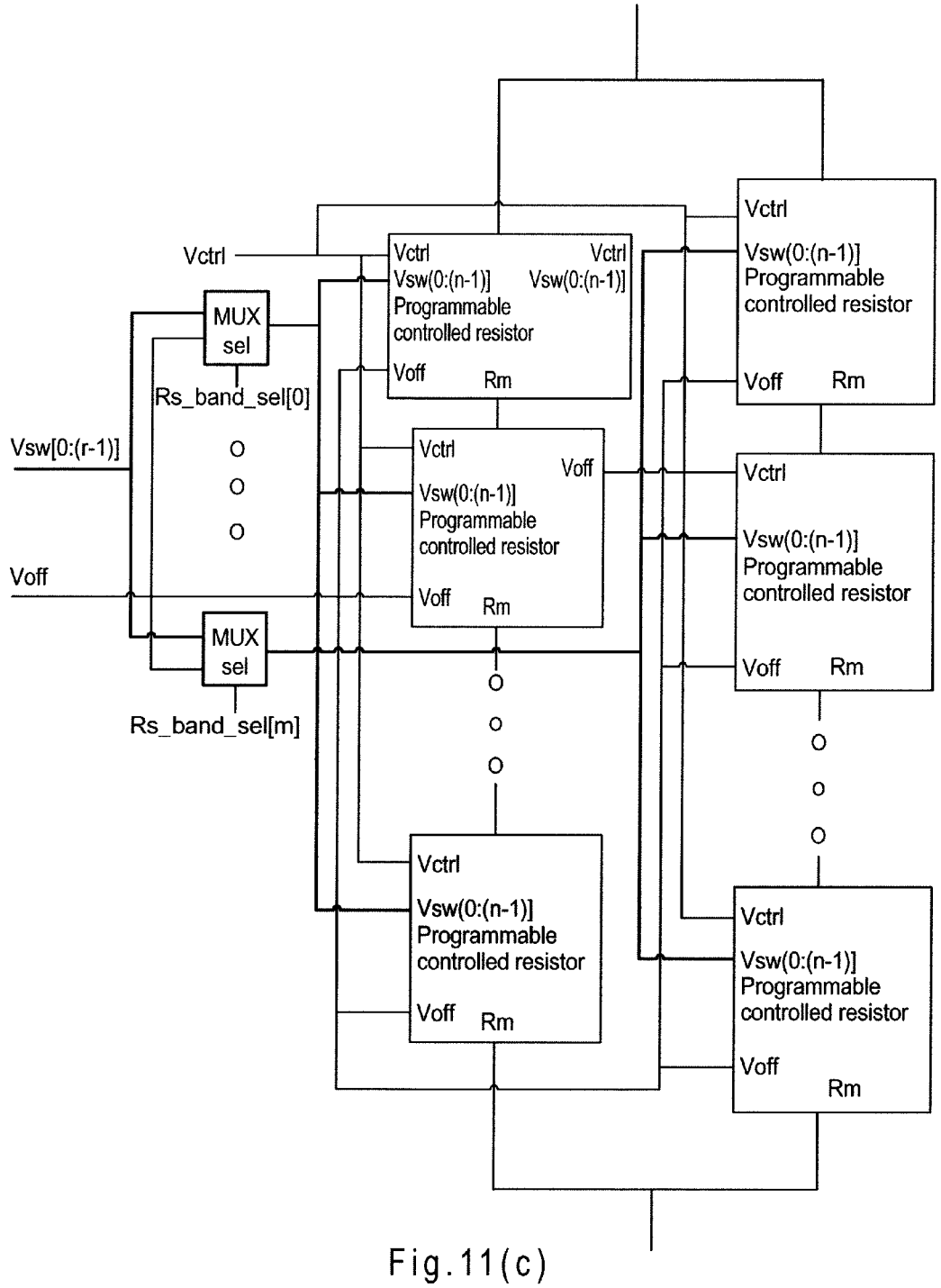
FIG. 11(c) is a block diagram showing a plurality of programmable controlled resistors connected in series and parallel.

$1/RsCs = 1/(p \cdot q) \cdot Rm \cdot Cm$ $1/(p \cdot q) \cdot Rm \cdot Cm = 1/(p \cdot q \cdot k \cdot ((Vconstant1/Vconstant2)/Cm \cdot Fdata) \cdot Cm)$ $1/(p \cdot q) \cdot Rm \cdot Cm = (1/p \cdot q \cdot k) \cdot (Vconstant2/Vconstant1) \cdot Fdata$; therefore $1/RsCs = (1/p \cdot q \cdot k) \cdot (Vconstant2/Vconstant1) \cdot Fdata$ Equation 5: Relationship Between the RsCs Time Constant and the Data Rate As discussed above, the transfer characteristic of the analog filter 504 tracks the data rate within the 1X to 2X data rate range. The transfer characteristic of the analog filter 504 may track the data rate through a wider range by dividing the wider range into bands. One or more programmable controlled resistors (Rm) 400 (FIG. 4(*a*)) may comprise the programmable controlled resistor (Rs) (FIG. 5). FIG. 11(*a*) is a block diagram showing a plurality of programmable controlled resistors Rm connected in series to provide Rs. FIG. 11(*b*) is a block diagram showing programmable controlled resistors Rm connected in parallel to provide Rs. FIG. 11(*c*) is a block diagram showing a plurality of programmable controlled resistors Rm connected in series and parallel to provide Rs.

Figure 12A:
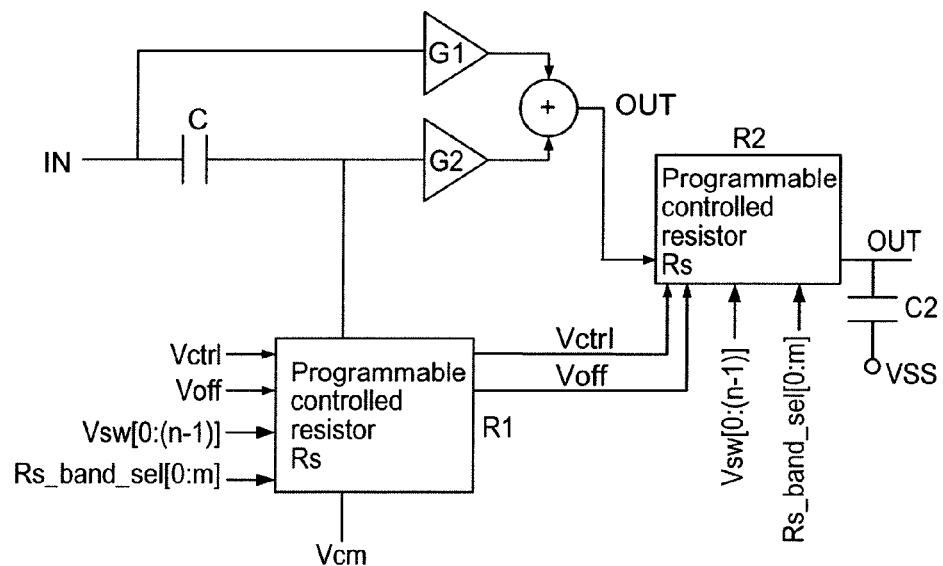
FIG. 12(a) is a circuit diagram of an embodiment of a filter having an adjustable low pass filter and an adjustable high pass filter.
Figure 12B:
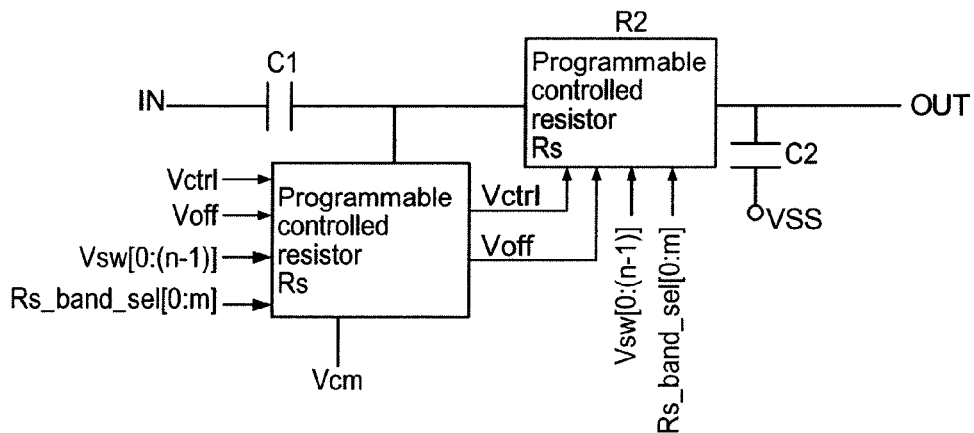
FIG. 12(b) is a circuit diagram the filter of FIG. 12(a) without gain buffers.

A wider range of linear operation may be achieved by establishing frequency bands such as 1X to 2X, 2X to 4X, 4X to 8X, 8X to 16X, etc. Referring again to FIG. 11(*b*), the plurality of programmable controlled resistors Rm[0], Rm[1], Rm[2], ..., Rm[m] that are parallel connected may be selectively activated (sub-combinations of programmable resistors may be formed) to provide different time constants. Each time constant may correspond to a frequency band. For example, the Rs parameter changes as follows as each additional resistor is activated: Rs, Rs/2, Rs/4, Rs/8, etc. In an embodiment, select resistors in different sections of the filter may be combined, each into sub-combinations, through an Rs band select signal (Rs_band sel[0:m]) as shown in FIGS. 12(*a*) and 12(*b*). Additional stages of the filters of FIGS. 12(*a*) and 12(*b*) may be cascaded to extend the transfer function to include more poles and zeros.

It is not necessary to establish frequency bands that are each 2X wide in order to obtain a wider range of linear operation. Each band may be less than or greater than 2X. For example, the bands may be divided as follows: 1X to 1.5X, 1.5X to 2.25X, 2.25X to 3.375X, ..., etc or 1X to 3X, 3X to 9X, 9X to 27X, ..., etc., or may follow any other multiple. It is noted that the calibration frequency is based on the multiple. For example, for bands that follow the multiple "1X to 1.5X", the calibration frequency is preferably the square root of $1.5X^2$ which is 1.22X. For bands that follow the multiple "1X to 3X", the calibration frequency is preferably the square root of $3X^2$ which is 1.73X.

The data rate tracking analog filter 500 can be used in any suitable application. For example, the data rate tracking analog filter 500 can be used in a phase-locked loop. The data rate tracking analog filter 500 can also be used in optical storage applications, such as in a differential phase detection circuit within an optical disc drive for reading optical discs such as DVD ROMS and other ROM media types (e.g., HD-DVD, Bluray, and those using other present or future standards). By way of background, in an optical pickup unit (e.g., in an optical disc drive), there is generally an array of at least four photodetectors, the main elements of which are referred to herein as the A, B, C, D photodetectors. When reading an optical disc, a spot of light is emitted onto the optical disc, and, under the influence of the pits and lands recorded on the disc, a diffraction pattern is imaged onto the A, B, C, D photodetectors. The image is converted into electrical signals that are provided to a differential phase detector, as well as to other circuits. The electrical signals are identical to each other except that, if the scanning spot is not on the track center line, they will be phase shifted with respect to each other. Accordingly, the amount that the A, B, C, D photodetector signals are phase shifted with respect to each other is proportional to the distance that the scanning spot is off the track center line. The output of the differential phase detector is indicative of the radial error and is digitized and provided to servo firmware to reposition the optics along the track center line.

Figure 13:
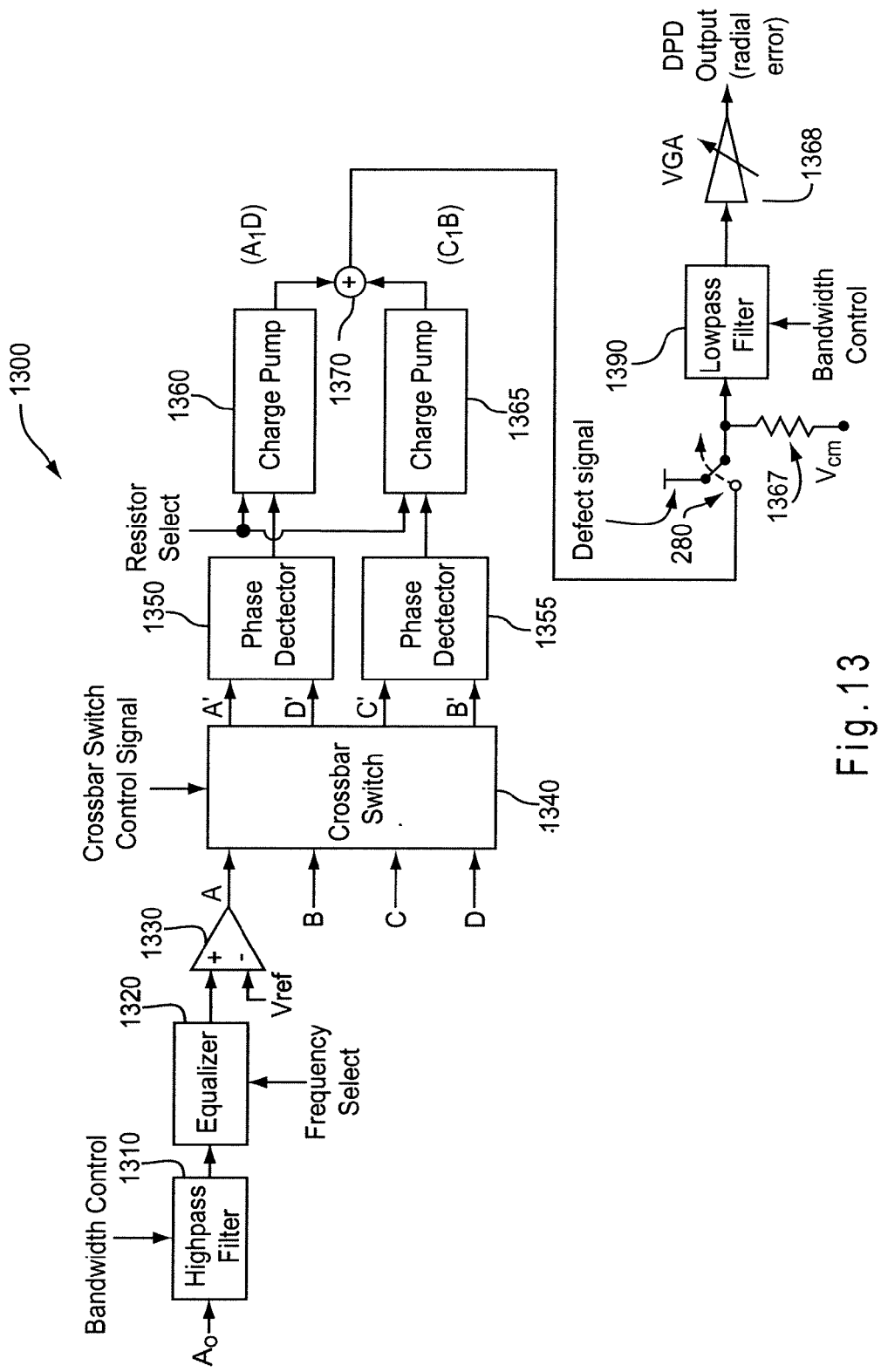
FIG. 13 is a functional block diagram of a differential phase detector of an embodiment.

Turning again to the drawings, FIG. 13 is a functional block diagram of a differential phase detector 1300 of an embodiment. As shown in FIG. 13, the differential phase detector 1300 comprises a highpass filter 1310, an analog filter or "equalizer" 1320, a comparator 1330, a crossbar switch 1340, first and second phase detectors 1350, 1355, first and second charge pumps 1360, 1365, a summer 1370, a switch 1380, a resistor 1367 tied to a common mode voltage $V_{cm}$, a lowpass filter 1390, and a gain-up stage amplifier VGA 1368. (To simplify the drawing, FIG. 13 only shows a highpass filter 1310, an equalizer 1320, and a comparator 1330 for the A signal. Similar components would be provided for the B, C, and D signals.) In operation, the highpass filter 1310 removes the DC content from the signal, as well as any low frequency perturbations caused by fingerprints or other effects. The highpass filter 1310 has a bandwidth control input for changing the location of the lower edge of the pass band. The equalizer 1320 provides a high frequency boost and, thereby, reduces the jitter of the photodetector signal prior to "slicing." The equalizer 1320 has a frequency select input for selecting the frequency boost. The equalizer 1320 may embody the data rate tracking analog filter 500. The comparator 1330 "slices" the signal to provide a square wave.

The sliced A, B, C, D outputs of the comparators are then provided to the crossbar switch 1340. In this differential phase detector 1300, in order to provide a more robust radial error signal, phase detection is performed on two pairs of photodetector signals (here, A and D, and B and C), and the outputs of the phase detectors 1350, 1355 are averaged. The crossbar switch 1340 provides the ability to remap the sliced photodiode signals, if necessary, to determine which photodetector signals are phase compared (e.g., A and C instead of A and D). This capability is useful for two reasons. First, since different optical pickup unit vendors tend to use dissimilar pinouts and naming conventions, the crossbar switch 1340 allows flexibility in laying out the printed circuit board. Accordingly, the crossbar switch 1340 allows flexibility in re-routing signals in the way that is useful to the differential phase detector 1300 irrespective of the conventions used by the manufacturer of the optical pickup unit. Second, the crossbar switch 1340 can be used to select either the DTD4 (Differential Time Detection, Type 4) or the DTD4a (Differential Time Detection, Type 4a) method of generating the radial position error signal.

Figure 14:
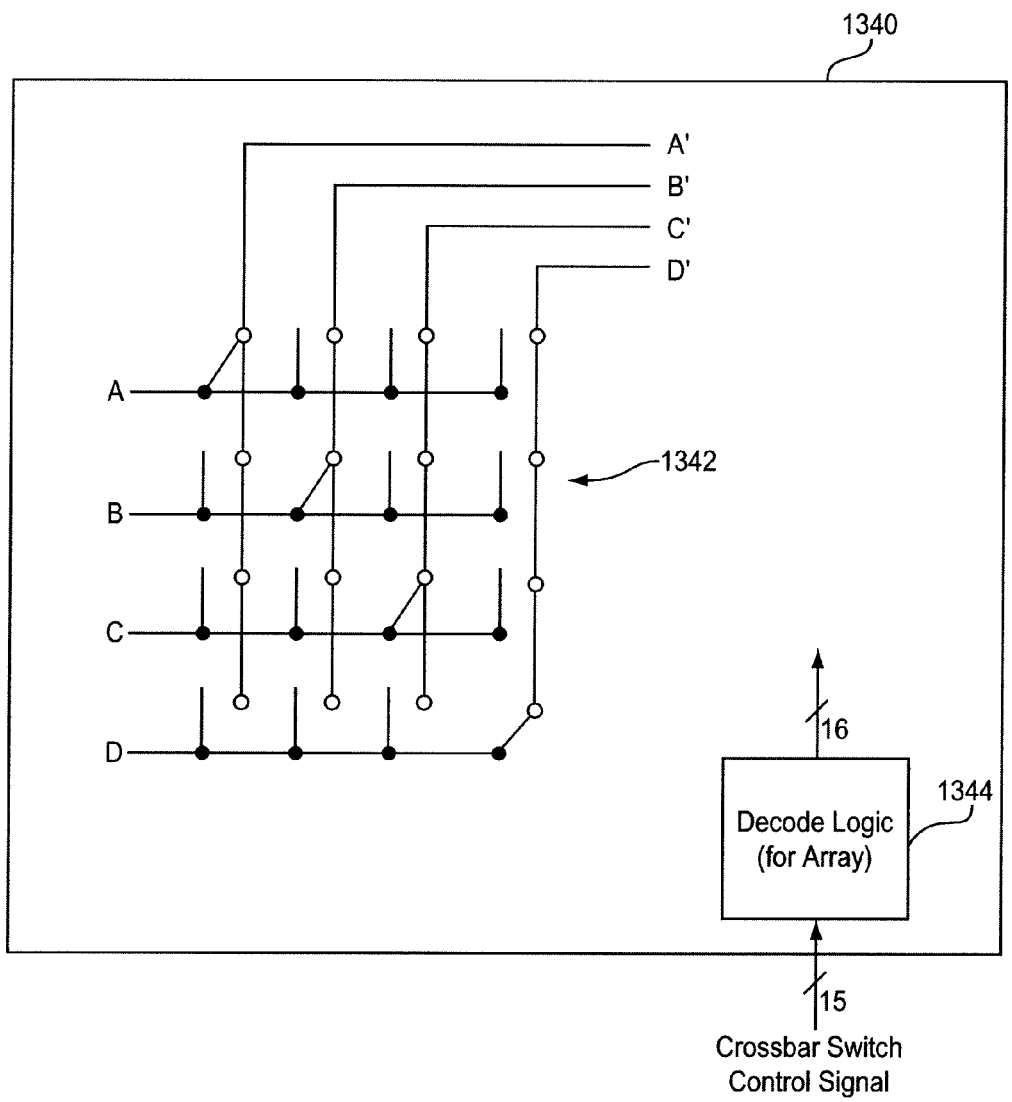
FIG. 14 is a functional block diagram of an embodiment of the crossbar switch of the differential phase detector of FIG. 13.

FIG. 14 is a functional block diagram of the crossbar switch 1340. As shown in FIG. 14, the crossbar switch 1340 comprises an array of switches 1342 and decode logic 1344 for the array 1342. There are 24 ways (4!) in which the four inputs to the crossbar switch 1340 can be connected to its four outputs. Based on the crossbar switch control signal, the decode logic 1344 selects one of 24 valid switch configurations. The decode logic 1344 maps a five-bit register value into the control signals that determine which of the 16 switches in the crossbar switch array 1342 are closed. In this embodiment, bits 4:3 of the register select which of the outputs the A input is connected to. Bits 2:1 select which of the remaining outputs receives the B input. Bit 0 selects which remaining output receives the C input. The D input is routed to whichever output is left. In one implementation, the normal setup for this register field results in no re-mapping of the sliced phase detector input signals.

Figure 15:
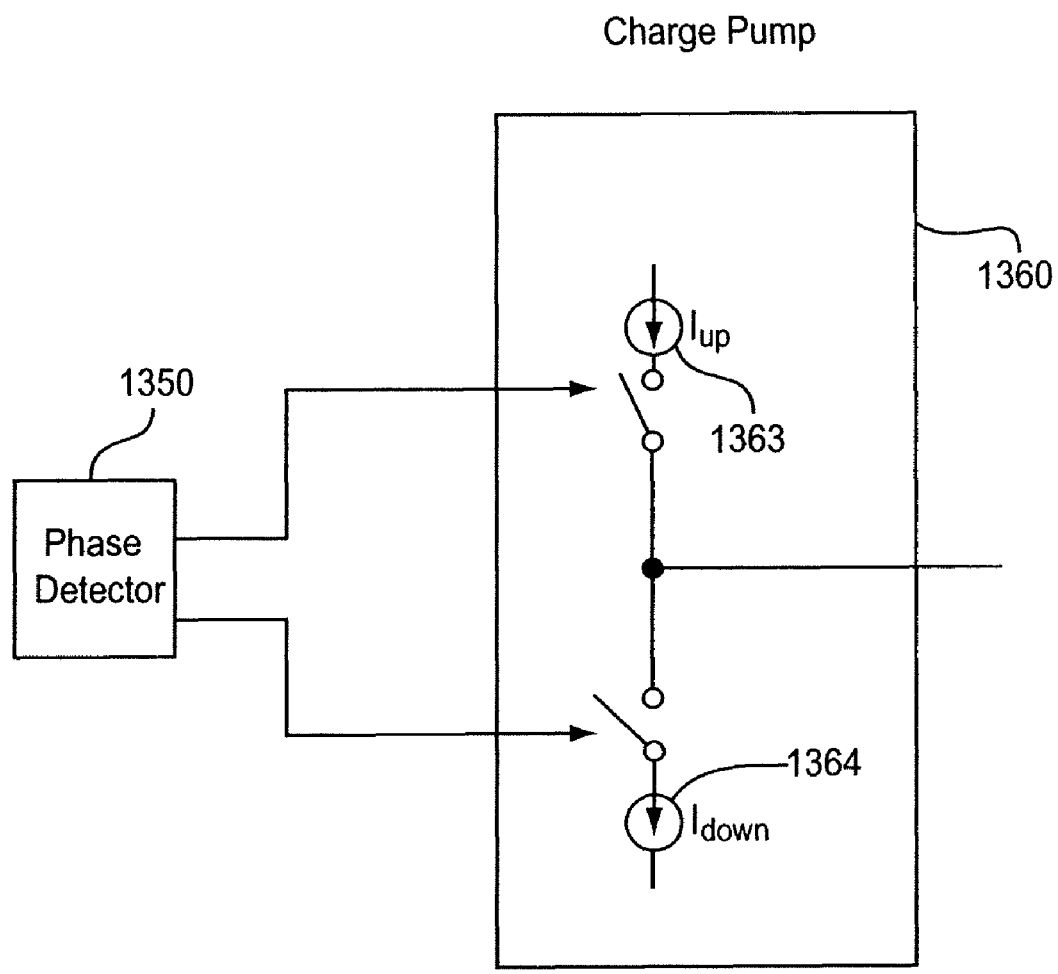
FIG. 15 is a functional block diagram of an embodiment of the charge pump of the differential phase detector of FIG. 13.

The paired outputs of the crossbar switch 1340 are provided to the first and second phase detectors 1350, 1355. The outputs of the first and second phase detectors 1350, 1355 are then provided to the first and second charge pumps 1360, 1365, respectively. FIG. 15 is a functional block diagram of one of the charge pumps 1360. As shown in FIG. 15, the charge pump 1360 comprises a "current up" current source $I_{up}$ 1363 and a "current down" current source $I_{down}$ 1364. The two current sources 1363, 1364 are connected to the $Q_A$ and $Q_B$ outputs of the phase detector 1350. When the $Q_A$ and $Q_B$ outputs are high, the corresponding switches close, providing or drawing current from the resistor 1367 that is tied to the common mode voltage $V_{an}$. The voltage is then provided to the lowpass filter 1390, followed by the gain-up stage amplifier VGA 1368.

Referring back to FIG. 13, the outputs of the first and second charge pumps 1360, 1365, are then summed by the summer 1370. The switch 1380 is used to prevent the output of the summer 1370 from reaching the lowpass filter 1390 if there is a detected defect in the optical storage media, as indicated by the defect signal. A defect in the optical storage media can be, for example, a fingerprint, scratch, or some imperfection on the surface of the disc that somehow scatters, defocuses, or redirects the reflected light. If such a defect is detected, the switch 1380 is thrown to a common mode voltage $V_{CM}$, which is essentially zero. This prevents an unreliable radial error signal from being provided to downstream components. If a defect is not detected, the output of the summer 1370 is provided to the lowpass filter 1390, which attenuates high frequency noise to smooth the signal before providing it to the gain-up stage amplifier VGA 1368.

Figure 16:
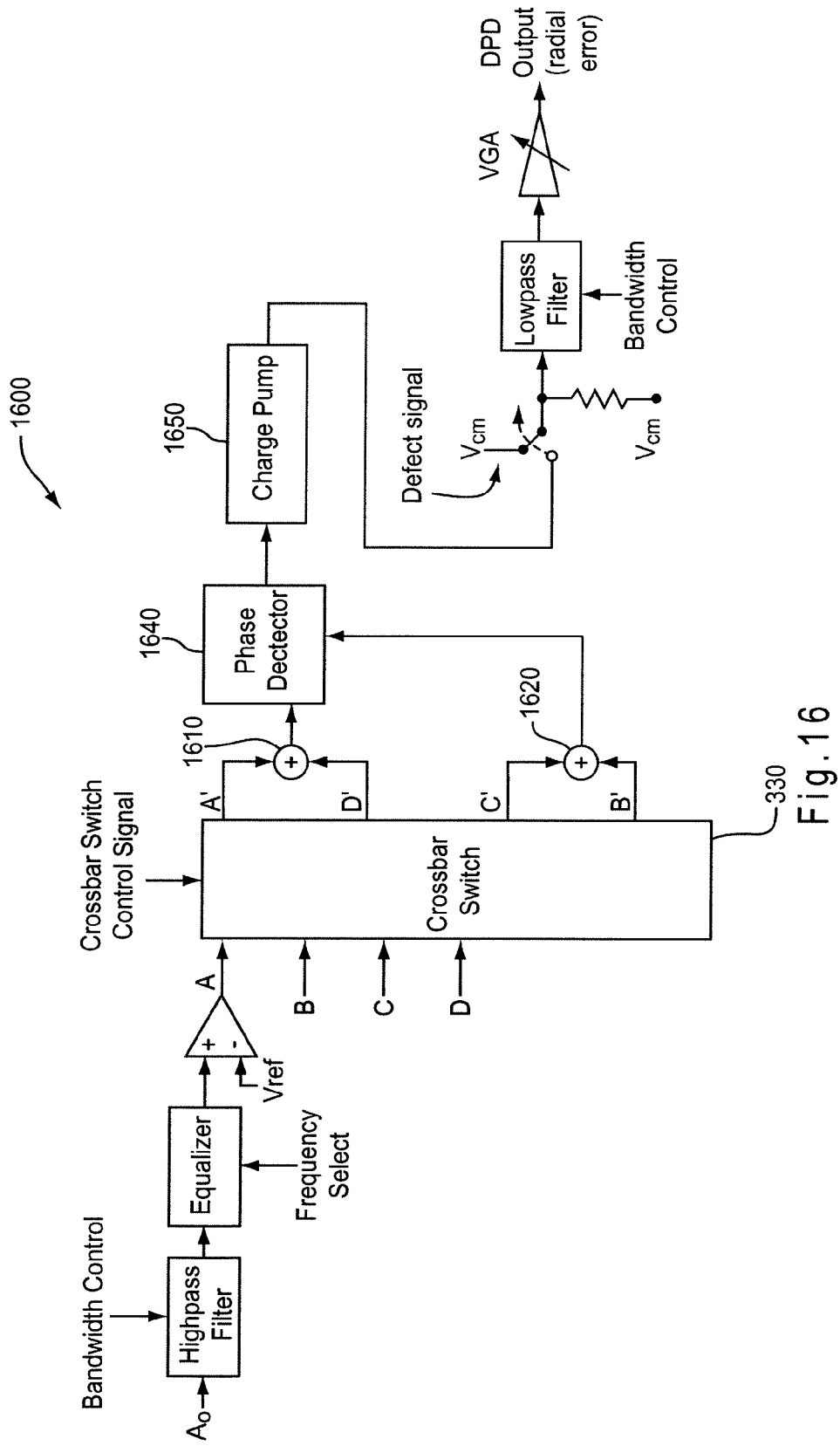
FIG. 16 is a functional block diagram of a differential phase detector of another embodiment.
Figure 17A:
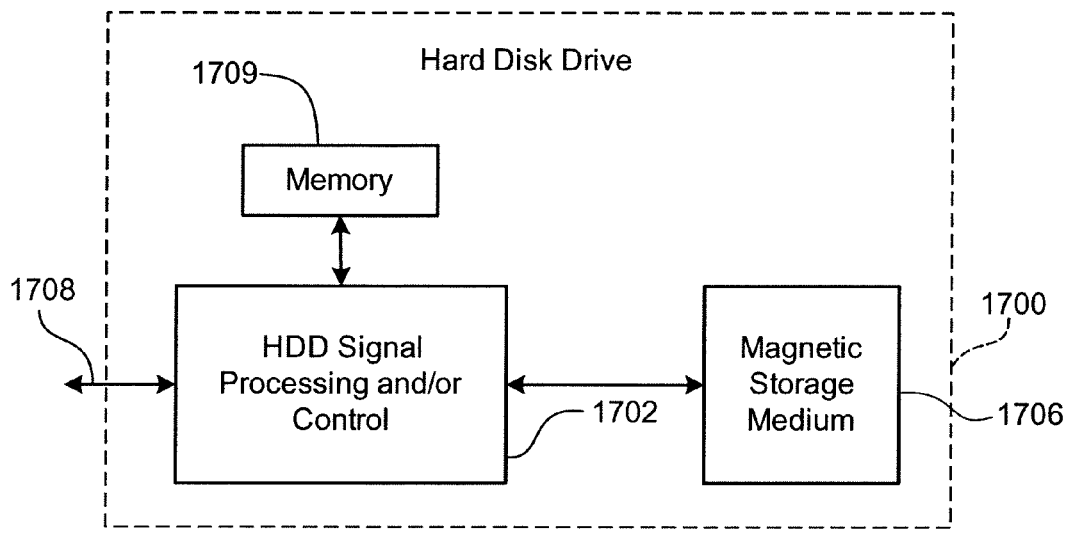
FIG. 17(a) is a functional block diagram of a hard disk drive.
Figure 17B:
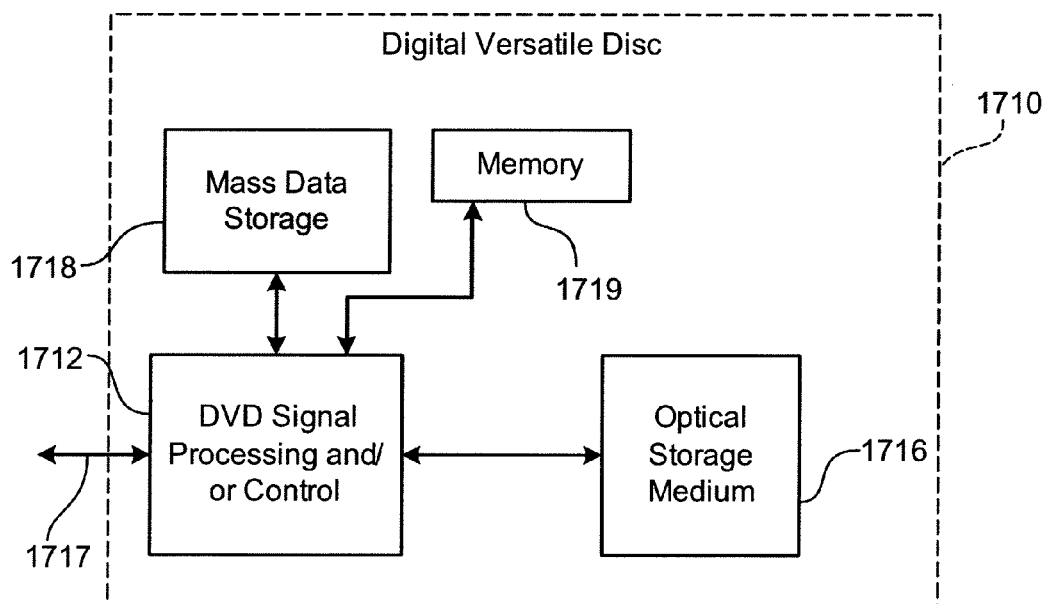
FIG. 17(b) is a functional block diagram of a digital versatile disk (DVD)
Figure 17C:
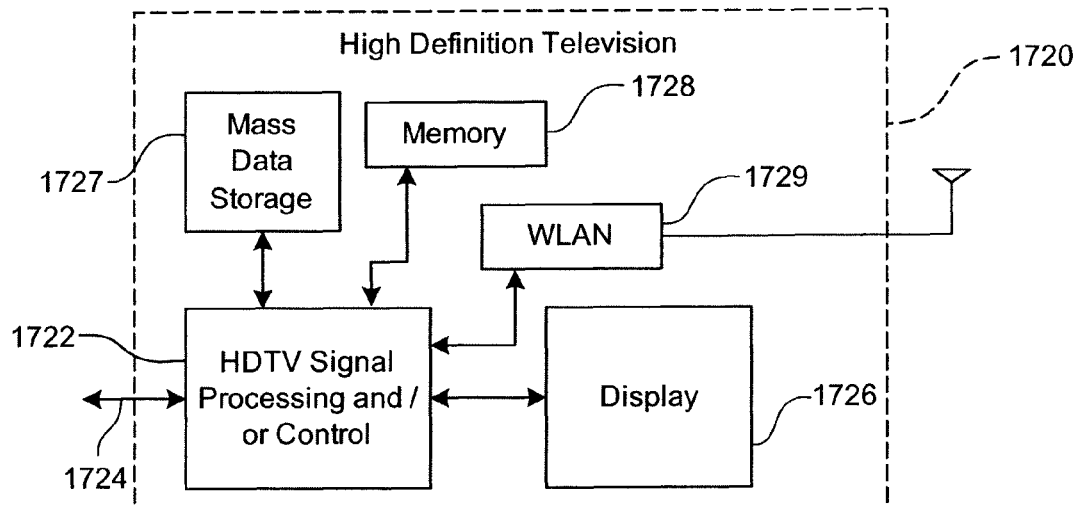
FIG. 17(c) is a functional block diagram of a high definition television.
Figure 17D:
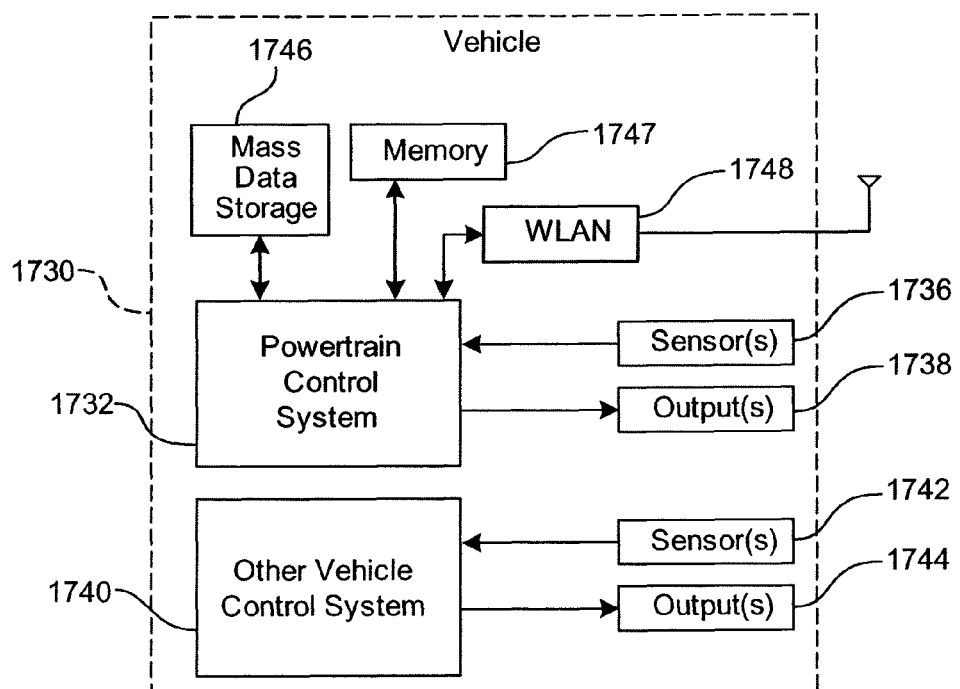
FIG. 17(d) is a functional block diagram of a vehicle control system.
Figure 17E:
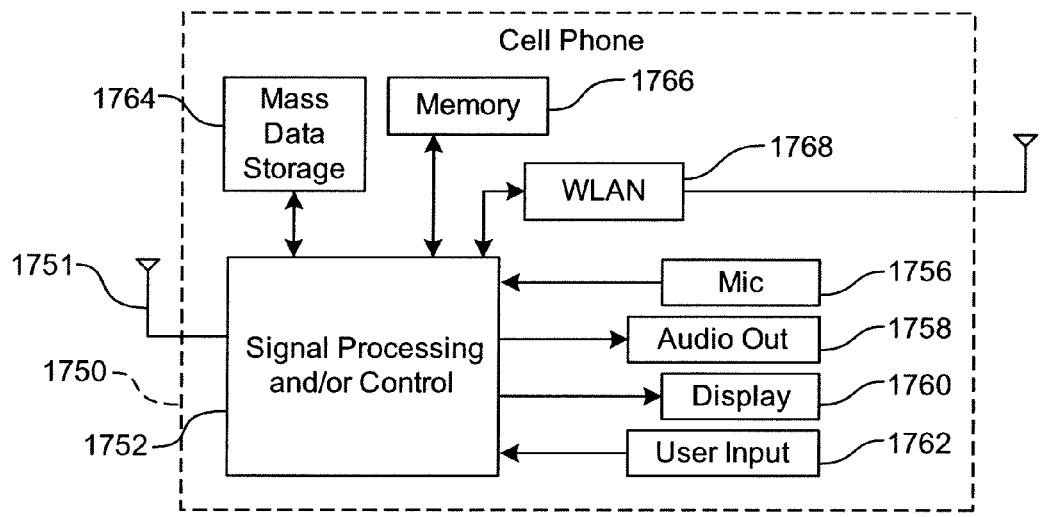
FIG. 17(e) is a functional block diagram of a cellular phone.
Figure 17F:
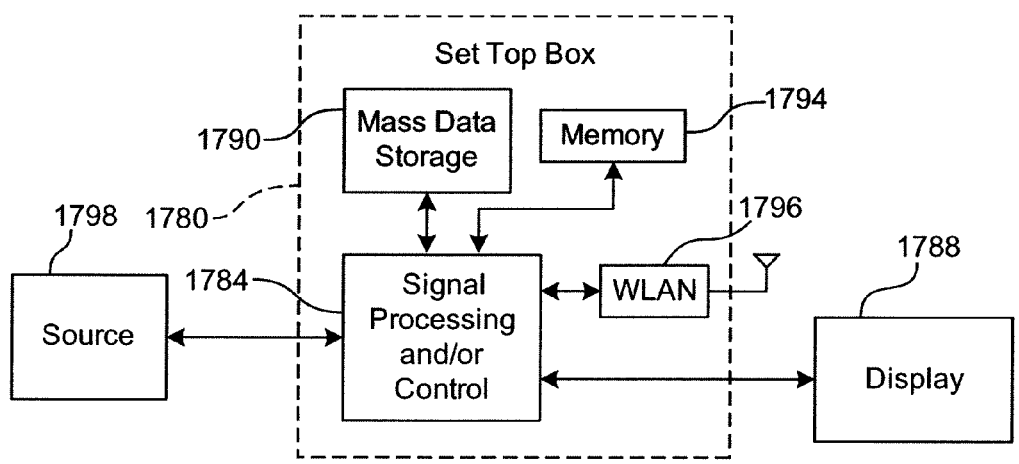
FIG. 17(f) is a functional block diagram of a set top box.
Figure 17G:
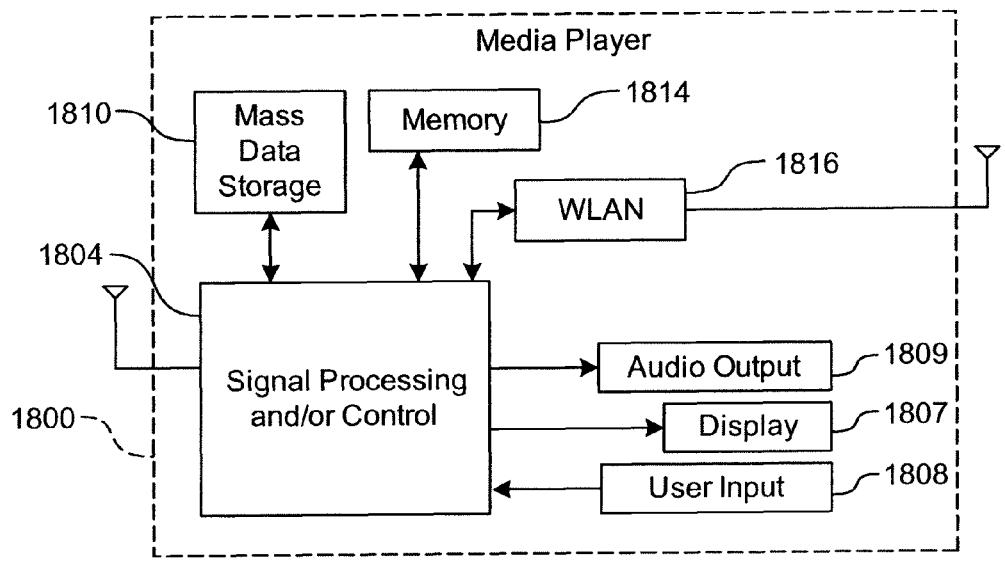
FIG. 17(g) is a functional block diagram of a media player.
Figure 17H:
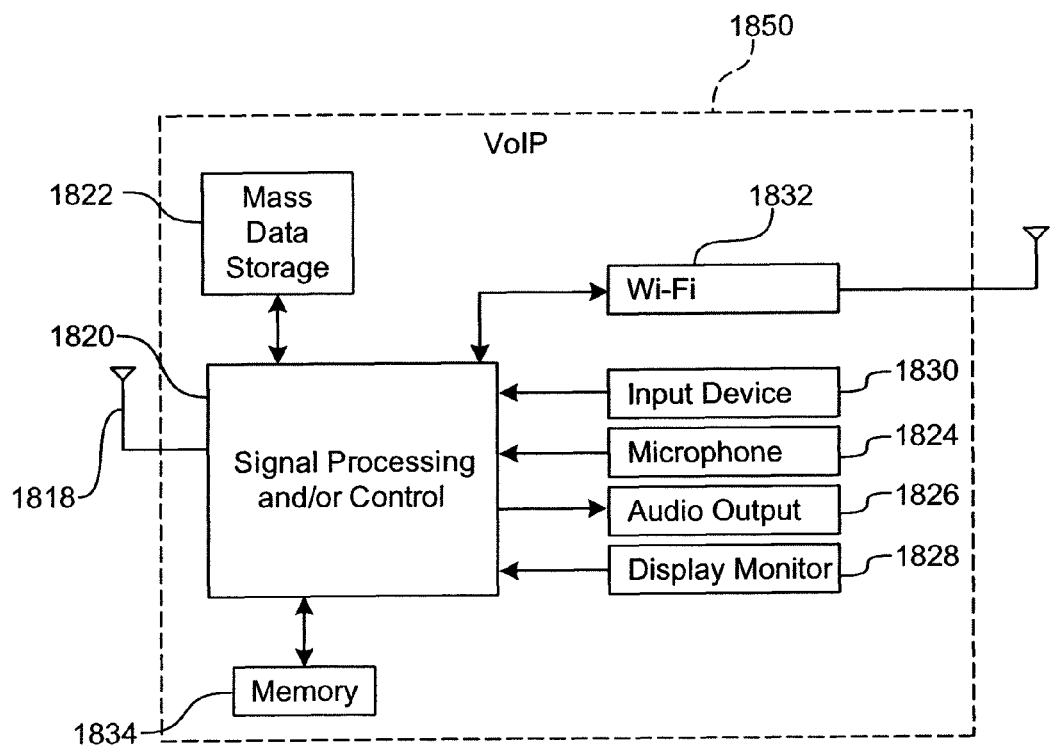
FIG. 17(h) is a functional block diagram of a VoIP phone.

It should be noted that alternatives to the differential phase detector shown in FIG. 13 can be used. Accordingly, the following claims should not be interpreted as requiring a specific type of phase detector unless explicitly recited therein. Additionally, as shown in the alternate differential phase detector 1600 in FIG. 16, the summing stage can be repositioned. In the alternate embodiment in FIG. 16, two summers 1610, 1620 are located between the crossbar switch 1630 and phase detector 1640 instead of after the charge pump 1650.

Referring now to FIGS. 17(*a*) to 17(*h*), various exemplary implementations of the present invention are shown. Referring to FIG. 17(*a*), the present invention may be embodied in a hard disk drive (HDD) 1700. HDD 1700 may communicate with a host device (not shown) such as a computer, mobile computing devices such as personal digital assistants, cellular phones, media or MP3 players and the like, and/or other devices via one or more wired or wireless communication links 1708.

The present invention may be implemented with either or both signal processing and/or control circuits, which are generally identified in FIG. 17(*a*) at 1702. In some implementations, the signal processing and/or control circuit 1702 and/or other circuits (not shown) in the HDD 1700 may process data, perform coding and/or encryption, perform calculations, and/ or format data that is output to and/or received from a magnetic storage median 1706. HDD 1700 may be connected to memory 1709, such as random access memory (RAM), a low latency nonvolatile memory such as flash memory, read only memory (ROM) and/or other suitable electronic data storage.

Referring now to FIG. 17 (*b*), the present invention may be implemented in a digital versatile disc (DVD) drive 1710. The present invention may be implemented in either or both signal processing and/or control circuits, which are generally identified in FIG. 17(*b*) at 1712, and/or mass data storage 1718 of DVD drive 1710. Signal processing and/or control circuit 1712 and/or other circuits (not shown) in DVD drive 1710 may process data, perform coding and/or encryption, perform calculations, and/or format data that is read from and/or data written to an optical storage median 1716. In some implementations, signal processing and/or control circuit 1712 and/or other circuits (not shown) in DVD drive 1710 can also perform other functions such as encoding and/or decoding and/or any other signal processing functions associated with a DVD drive.

DVD drive 1710 may communicate with a device (not shown) such as a computer, television or other device via one or more wired or wireless communication links 1717. DVD drive 1710 may communicate with mass data storage 1718 that stores data in a nonvolatile manner. Mass data storage 1718 may include a HDD such as that shown in FIG. 17(*a*). The HDD may be a mini HDD that includes one or more platters having a diameter that is smaller than approximately 1.8". DVD drive 1710 may be connected to memory 1719, such as RAM, ROM, low latency nonvolatile memory such as flash memory, and/or other suitable electronic data storage.

Referring now to FIG. 17 (*c*) the present invention may be embodied in a high definition television (HDTV) 1720. The present invention may be implemented in either or both signal processing and/or control circuits, which are generally identified in FIG. 17(*c*) at 1722, a WLAN interface 1729 and/or mass data storage 1727 of the HDTV 1720. HDTV 1720 may receive HDTV input signals in either a wired or wireless format via one or more wired or wireless communication links 1724 and generate HDTV output signals for a display 1726. In some implementations, signal processing circuit and/or control circuit 1722 and/or other circuits (not shown) of HDTV 1720 may process data, perform coding and/or encryption, perform calculations, format data and/or perform any other type of HDTV processing that may be required.

HDTV 1720 may communicate with mass data storage 1727 that stores data in a nonvolatile manner such as optical and/or magnetic storage devices. At least one HDD may have the configuration shown in either FIG. 17(*a*) and/or at least one DVD may have the configuration shown in FIG. 17(*b*). The HDD may be a mini HDD that includes one or more platters having a diameter that is smaller than approximately 1.8". HDTV 1720 may be connected to memory 1728 such as RAM, ROM, low latency nonvolatile memory such as flash memory and/or other suitable electronic data storage. HDTV 1720 also may support connections with a WLAN via a WLAN network interface 1729.

Referring now to FIG. 17(*d*), the present invention may be implemented in a control system of a vehicle 1730, a WLAN interface 1748 and/or mass data storage 1746 of the vehicle control system. In some implementations, the present invention is implemented in a power-train control system 1732 that receives inputs from one or more sensors 1736 such as temperature sensors, pressure sensors, rotational sensors, airflow sensors and/or any other suitable sensors and/or that generates one or more output control signals such as engine operating parameters, transmission operating parameters, and/or other control signals at one or more output(s) 1738.

The present invention may also be embodied in other control systems 1740 of vehicle 1730. Control system 1740 may likewise receive signals from input sensors 1742 and/or output control signals to one or more output(s) 1744. In some implementations, control system 1740 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1732 may communicate with mass data storage 1746 that stores data in a nonvolatile manner. Mass data storage 1746 may include optical and/or magnetic storage devices, for example HDDs and/or DVDs. At least one HDD may have the configuration shown in FIG. 17(*a*) and/or at least one DVD may have the configuration shown in FIG. 17(*b*). The HDD may be a mini HDD that includes one or more platters having a diameter that is smaller than approximately 1.8". Powertrain control system 1732 may be connected to memory 1747 such as RAM, ROM, low latency nonvolatile memory such as flash memory and/or other suitable electronic data storage. Powertrain control system 1732 also may support connections with a WLAN via a WLAN network interface 1748. The control system 1740 may also include mass data storage, memory and/or a WLAN interface (all not shown).

Referring now to FIG. 17(*e*), the present invention may be embodied in a cellular phone 1750 that may include a cellular antenna 1751. The present invention may be implemented in either or both signal processing and/or control circuits, which are generally identified in FIG. 17(*e*) at 1752, a WLAN interface and/or mass data storage of the cellular phone 1750. In some implementations, cellular phone 1750 includes a microphone 1756, an audio output 1758 such as a speaker and/or audio output jack, a display 1760 and/or an input device 1762 such as a keypad, pointing device, voice actuation and/or other input device. Signal processing and/or control circuits 1752 and/or other circuits (not shown) in cellular phone 1750 may process data, perform coding and/or encryption, perform calculations, format data and/or perform other cellular phone functions.

Cellular phone 1750 may communicate with mass data storage 1764 that stores data in a nonvolatile manner such as optical and/or magnetic storage devices, for example HDDs and/or DVDs. At least one HDD may have a configuration shown in FIG. 17(*a*) and/or at least one DVD may have the configuration shown in FIG. 17(*b*). The HDD may be a mini HDD that includes one or more platters having a diameter that is smaller than approximately 1.8". Cellular phone 1750 may be connected to memory 1766 such as RAM, ROM, low latency nonvolatile memory such as flash memory and/or other suitable electronic data storage. Cellular phone 1750 also may support connections with a WLAN via a WLAN network interface 1768.

Referring now to FIG. 17(*f*), the present invention may be embodied in a set top box 1780. The present invention may be implemented in either or both signal processing and/or control circuits, which are generally identified in FIG. 17(*f*) at 1784, a WLAN interface and/or mass data storage of the set top box 1780. Set top box 1780 receives signals from a source such as a broadband source and outputs standard and/or high definition audio/video signals suitable for a display 1788 such as a television and/or monitor and/or other video and/or audio output devices. Signal processing and/or control circuits 1784 and/or other circuits (not shown) of the set top box 1780 may process data, perform coding and/or encryption, perform calculations, format data and/or perform any other set top box function.

Set top box 1780 may communicate with mass data storage 1790 that stores data in a nonvolatile manner Mass data storage 1790 may include optical and/or magnetic storage devices, for example HDDs and/or DVDs. At least one HDD may have a configuration shown in FIG. 17(*a*) and/or at least one DVD may have the configuration shown in FIG. 17(*b*). The HDD may be a mini HDD that includes one or more platters having a diameter that is smaller than approximately 1.8". Set top box 1780 may be connected to memory 1794 such as RAM, ROM, low latency nonvolatile memory such as flash memory and/or other suitable electronic data storage. Set top box 1780 also may support connections with a WLAN via a WLAN network interface 1796.

Referring now to FIG. 17(*g*), the present invention may be embodied in a media player 1800. The present invention may be implemented in either or both signal processing and/or control circuits, which are generally identified in FIG. 17(*g*) at 1804, a WLAN interface and/or mass data storage of the media player 1800. In some implementations, media player 1800 includes a display 1807 and/or a user input 1808 such as a keypad, touchpad and the like. In some implementations, media player 1800 may employ a graphical user interface (GUI) that typically employs menus, drop down menus, icons and/or a point-and-click interface via display 1807 and/or user input 1808. Media player 1800 further includes an audio output 1809 such as a speaker and/or audio output jack. Signal processing and/or control circuits 1804 and/or other circuits (not shown) of media player 1800 may process data, perform coding and/or encryption, perform calculations, format data and/or pedal in any other media player function.

Media player 1800 may communicate with mass data storage 1810 that stores data such as compressed audio and/or video content in a nonvolatile manner. In some implementations, the compressed audio files include files that are compliant with MP3 format or other suitable compressed audio and/or video formats. The mass data storage 1810 may include optical and/or magnetic storage devices, for example HDDs and/or DVDs. At least one HDD may have a configuration shown in FIG. 17(*a*) and/or at least one DVD may have the configuration shown in FIG. 17(*b*). The HDD may be a mini HDD that includes one or more platters having a diameter that is smaller than approximately 1.8".

Media player 1800 may be connected to memory 1814 such as RAM, ROM, low latency nonvolatile memory such as flash memory and/or other suitable electronic data storage. Media player 1800 also may support connections with a WLAN via a WLAN network interface 1816. Still other implementations in addition to those described above are contemplated.

Referring to FIG. 17(*h*), the present invention may be embodied in a Voice over Internet Protocol (VoIP) phone 1850 that may include an antenna 1818. The present invention may be implemented in either or both signal processing and/or control circuits, which are generally identified in FIG. 17(*h*) at 1820, a wireless interface and/or mass data storage of the VoIP phone 1850. In some implementations, VoIP phone 1850 includes, in part, a microphone 1824, an audio output 1826 such as a speaker and/or audio output jack, a display monitor 1828, an input device 1830 such as a keypad, pointing device, voice actuation and/or other input devices, and a Wi-Fi communication module 1832. Signal processing and/or control circuits 1820 and/or other circuits (not shown) in VoIP phone 1850 may process data, perform coding and/or encryption, perform calculations, format data and/or perform other VoIP phone functions.

VoIP phone 1850 may communicate with mass data storage 1822 that stores data in a nonvolatile manner such as optical and/or magnetic storage devices, for example HDDs and/or DVDs. At least one HDD may have a configuration shown in FIG. 17(*a*) and/or at least one DVD may have the configuration shown in FIG. 17(*b*). The HDD may be a mini HDD that includes one or more platters having a diameter that is smaller than approximately 1.8". VoIP phone 1850 may be connected to memory 1834, which may be a RAM, ROM, low latency nonvolatile memory such as flash memory and/or other suitable electronic data storage. VoIP phone 1850 is configured to establish communications link with a VoIP network (not shown) via Wi-Fi communication module 1832.

All of the discussion above, regardless of the particular implementation being described, is exemplary in nature, rather than limiting. Although specific components of the data rate tracking analog filter are described, methods, systems, and articles of manufacture consistent with the data rate tracking analog filter may include additional or different components. For example, components of the data rate tracking analog filter may be implemented by one or more of control logic, hardware, a microprocessor, microcontroller, application specific integrated circuit (ASIC), discrete logic, or a combination of circuits and/or logic. Further, although selected aspects, features, or components of the implementations are depicted as hardware or software, all or part of the systems and methods consistent with the data rate tracking analog filter may be stored on, distributed across, or read from machine-readable media, for example, secondary storage devices such as hard disks, floppy disks, and CD-ROMs; a signal received from a network; or other forms of ROM or RAM either currently known or later developed. Any act or combination of acts may be stored as instructions in computer readable storage median. Memories may be DRAM, SRAM, Flash or any other type of memory. Programs may be parts of a single program, separate programs, or distributed across several memories and processors.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs and rule sets may be parts of a single program or rule set, separate programs or rule sets, or distributed across several memories and processors.

It is intended that the foregoing detailed description be understood as an illustration of selected forms that the invention can take and not as a definition of the invention. It is only the following claims, including all equivalents, that are intended to define the scope of this invention.

What is claimed is:

1. A method comprising:
   determining a first control signal based on a frequency range of an input signal to a filter, wherein a parameter of the filter is adjustable based on the first control signal, the input signal having a changing frequency;
   monitoring the frequency of the input signal and responsively adjusting a second control signal based on the frequency;
   communicating the second control signal to the filter to adjust the parameter;
   wherein the parameter determines a transfer characteristic of the filter;
   converting the frequency to a first frequency signal;
   generating a second frequency signal that mirrors the first frequency signal; and
   adjusting the second control signal based on the second frequency signal.

2. The method of claim 1 wherein the parameter is a resistance value of the filter and the frequency of the input signal corresponds to a data rate of the input signal.

3. The method of claim 1 wherein the parameter corresponds to an approximate median frequency of the input signal within the frequency range.

4. The method of claim 1 wherein, at an approximate median frequency of the input signal within the frequency range, the parameter is an approximate median voltage within a linear region of a gate voltage-to-resistance characteristic.

5. The method of claim 1 further comprising applying the second control signal as a gate voltage to a plurality of gate-controlled resistors that comprise the filter.

6. The method of claim 5 wherein the first control signal corresponds to a sub-combination of the plurality of gate-controlled resistors.

7. The method of claim 1 wherein converting the frequency to the first frequency signal comprises:
   generating a voltage based on the frequency and the first frequency signal; and
   generating the first frequency signal based on comparing the generated voltage to a constant voltage.

8. The method of claim 1 further comprising comparing a constant voltage to a node voltage to generate the second control signal, wherein the node voltage is based on the first control signal and the second frequency signal.

9. The method of claim 1 further comprising communicating a third control signal to the filter to select a combination of programmable controlled resistors among a plurality of programmable controlled resistors, wherein the third control signal is adjustable based on the frequency of the input signal.

10. The method of claim 1 further comprising determining a radial error signal for an optical disk drive based on the input signal.

11. An apparatus comprising:
    a signal filter;
    a first circuit to determine a first control signal based on a frequency range of an input signal to the signal filter, wherein a parameter of the signal filter is adjustable based on the first control signal, the input signal having a changing frequency; and
    a second circuit to monitor the frequency of the input signal and responsively adjust a second control signal based on the frequency; and
    a third circuit to convert the frequency to a first frequency signal, generate a second frequency signal that mirrors the first frequency signal, and communicate the second frequency signal to the second circuit to adjust the second control signal,
    wherein the second control signal is communicated to the signal filter to adjust the parameter, and the parameter determines a transfer characteristic of the signal filter.

12. The apparatus of claim 11 wherein the parameter is a resistance value of the signal filter and the frequency of the input signal corresponds to a data rate of the input signal.

13. The apparatus of claim 12 wherein the signal filter comprises a plurality of programmable controlled resistors to receive a third control signal that selects a sub-combination of the programmable controlled resistors.

14. The apparatus of claim 12 further comprising a differential phase detection circuit that includes the signal filter.

15. The apparatus of claim 14 further comprising an optical disk drive that includes the differential phase detection circuit.

16. The apparatus of claim 11 wherein the parameter corresponds to an approximate median frequency of the input signal within the frequency range.

17. The apparatus of claim 11 wherein the signal filter includes a variable resistor implemented by a transistor, and wherein at an approximate median frequency of the input signal within the frequency range, the parameter is an approximate median voltage within a linear region of a gate voltage-to-resistance characteristic of the transistor.

18. The apparatus of claim 11 wherein the signal filter comprises a plurality of gate-controlled resistors to receive the second control signal as a gate voltage.

19. The apparatus of claim 18 wherein the first control signal corresponds to a combination of the plurality of gate-controlled resistors.

20. The apparatus of claim 11 wherein the third circuit comprises:
- a constant voltage source to generate a constant voltage;
- a switched capacitor to generate a voltage based on the frequency and the first frequency signal; and
- a voltage amplifier to generate the first frequency signal based on the generated voltage and the constant voltage.

21. The apparatus of claim 11 further comprising:
- a constant voltage source to generate a constant voltage; and
- a voltage amplifier to:
  - receive the constant voltage at a first input and a node voltage at a second input, and
  - output the second control signal, wherein the node voltage is based on the first control signal and the second frequency signal.

22. The apparatus of claim 11 further comprising a programmable controlled resistor to receive the first and second control signals.

23. An apparatus comprising:
- a signal filter;
- a first circuit to determine a first control signal based on a frequency range of an input signal to the signal filter, wherein a parameter of the signal filter is adjustable based on the first control signal, the input signal having a changing frequency;
- a second circuit to monitor the frequency of the input signal and responsively adjust a second control signal based on the frequency, wherein the first circuit includes a calibrator having an increment and decrement counter to receive an output from a comparator, the comparator having a first input for receiving a first voltage from a constant voltage source and a second input for receiving a second voltage, wherein the second voltage is based on a substantially median frequency within the frequency range.

\* \* \* \* \*